US009941126B2

(12) United States Patent
Funk et al.

(10) Patent No.: US 9,941,126 B2
(45) Date of Patent: Apr. 10, 2018

(54) MICROWAVE PLASMA DEVICE

(71) Applicant: Tokyo Electron Limited, Minato-ku, Tokyo (JP)

(72) Inventors: Merritt Funk, Austin, TX (US); Jianping Zhao, Austin, TX (US); Lee Chen, Cedar Creek, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/309,090

(22) Filed: Jun. 19, 2014

(65) Prior Publication Data

US 2014/0377966 A1    Dec. 25, 2014

Related U.S. Application Data

(60) Provisional application No. 61/836,916, filed on Jun. 19, 2013, provisional application No. 61/900,684, filed on Nov. 6, 2013.

(51) Int. Cl.
*H01L 21/268*     (2006.01)
*H01J 37/32*      (2006.01)

(52) U.S. Cl.
CPC ........ *H01L 21/268* (2013.01); *H01J 37/3222* (2013.01); *H01J 37/32192* (2013.01); *H01J 37/32266* (2013.01)

(58) Field of Classification Search
CPC ........... H01J 37/32192; H01J 37/32262; H01J 37/3222; H01L 21/2686
USPC .............................. 156/345.41; 118/723 MW
See application file for complete search history.

(56) References Cited

U.S. PATENT DOCUMENTS

| 4,776,918 | A | * | 10/1988 | Otsubo | C23C 16/517 118/50.1 |
|---|---|---|---|---|---|
| 5,134,965 | A | | 8/1992 | Tokuda et al. | |
| 5,234,526 | A | * | 8/1993 | Chen | H01J 37/32192 118/252 |
| 5,632,921 | A | | 5/1997 | Risman et al. | |
| 5,803,975 | A | * | 9/1998 | Suzuki | C23C 16/345 118/723 MA |
| 6,225,745 | B1 | * | 5/2001 | Srivastava | 315/111.51 |

(Continued)

OTHER PUBLICATIONS

International Patent Application Serial No. PCT/US2014/023724, "International Search Report," International Filing Date Mar. 11, 2014, Search Report dated Jul. 25, 2014.

(Continued)

*Primary Examiner* — Rakesh K Dhingra
(74) *Attorney, Agent, or Firm* — Rothwell, Figg, Ernst & Manbeck, P.C.

(57) ABSTRACT

A processing system is disclosed, having a power transmission element with an interior cavity that propagates electromagnetic energy proximate to a continuous slit in the interior cavity. The continuous slit forms an opening between the interior cavity and a substrate processing chamber. The electromagnetic energy may generate an alternating charge in the continuous slit that enables the generation of an electric field that may propagate into the processing chamber. The electromagnetic energy may be conditioned prior to entering the interior cavity to improve uniformity or stability of the electric field. The conditioning may include, but is not limited to, phase angle, field angle, and number of feeds into the interior cavity.

14 Claims, 16 Drawing Sheets

(56) References Cited

U.S. PATENT DOCUMENTS

| | | | |
|---|---|---|---|
| 6,497,783 B1* | 12/2002 | Suzuki et al. | 156/345.1 |
| 6,652,709 B1* | 11/2003 | Suzuki et al. | 156/345.41 |
| 7,348,732 B2 | 3/2008 | Espiau et al. | |
| 7,592,564 B2 | 9/2009 | Kumar et al. | |
| 8,136,479 B2 | 3/2012 | Sugai et al. | |
| 8,487,223 B2 | 7/2013 | Kimrey, Jr. | |
| 2003/0178143 A1* | 9/2003 | Perrin | H01J 37/32192 156/345.41 |
| 2005/0173382 A1* | 8/2005 | Ishii et al. | 219/121.43 |
| 2006/0003603 A1* | 1/2006 | Fukuchi | 438/787 |
| 2006/0086322 A1* | 4/2006 | Lagarde et al. | 118/723 MW |
| 2007/0128876 A1* | 6/2007 | Fukiage | C23C 16/4405 438/710 |
| 2009/0026963 A1* | 1/2009 | Susuki | 315/111.21 |
| 2009/0045749 A1* | 2/2009 | Ganachev et al. | 315/111.21 |
| 2013/0192760 A1 | 8/2013 | Ikeda et al. | |

OTHER PUBLICATIONS

Written Opinion dated Jul. 25, 2014 in PCT/US 14/23724 (11 pages).
International Search Report and Written Opinion dated Jan. 29, 2015 in PCT/US14/64360 (11 pages).

* cited by examiner

MICROWAVE PLASMA DEVICE

CROSS REFERENCE TO RELATED APPLICATION

Pursuant to 37 C.F.R. § 1.78(a)(4), this application claims the benefit of and priority to prior filed Provisional Application Ser. No. 61/836,916 filed Jun. 19, 2013, and No. 61/900,684 filed Nov. 6, 2013 which is expressly incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Typically, uniformly etching substrates using plasma (e.g., ionized gases) generated by microwave or radio frequency power can be difficult to accomplish.

Conventional hardware and processing techniques may result in a non-uniform distribution of ions or plasma density across the substrate. The plasma density non-uniformity may result in non-uniform etching or removal of portions of the substrate. Traditional plasma sources may generate non-uniform plasma density across the substrate based on the location of the plasma source relative to the substrate. Generally, plasma sources are located opposite or parallel to the substrate. Unfortunately, plasma sources may not uniformly emit power across their surface to generate a uniform plasma density across the substrate. This may be due to the inability to emit power uniformly at the edge of the plasma source. Increasing the size of the plasma source to improve plasma density uniformity across the substrate may not be practical or possible. Thus, any means that can improve the plasma density near the edge of the substrate would be desirable.

SUMMARY OF THE INVENTION

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate.

The plasma chamber may include one or more surface wave plasma sources (e.g., power transmission elements) that can emit electromagnetic energy to ionize gas that is delivered via a gas delivery system. One of the power transmission elements may include an interior cavity that can propagate electromagnetic waves that may be provided by a power source. A continuous slit or opening may be along the interior cavity that provides an opening that develops an alternating potential difference that may generate an electromagnetic field that propagates into the plasma chamber. The continuous slit may include a dielectric component that may be arranged to cover at least a portion of the continuous slit or opening. The dielectric component may be configured to enable the transmission electromagnetic energy or power signal into the plasma chamber. The plasma generated by the electromagnetic energy may be used to treat a substrate on a substrate holder that may be located adjacent or near the power transmission element. In one embodiment, the electromagnetic energy may be generated by a surface wave or microwave energy source that may be coupled to the interior cavity.

The microwave energy or electromagnetic waves may propagate through the interior cavity that emits microwave energy from the continuous slit through the dielectric component and into the plasma chamber. The size, shape, and orientation of the interior cavity, continuous slit, and the dielectric component may vary based on the processing requirements for treating the substrate. For example, the interior cavity cross section geometry may vary between circular, rectangular, or square depending on the desired plasma processing conditions.

In one embodiment, the power transmission element may include a power distribution element disposed within the interior cavity and located opposite the power feed opening that receive the electromagnetic waves. The power distribution element may be a physical object that is placed in the path of the incoming electromagnetic waves into the interior cavity. The size and shape, of the power distribution element, may be arranged in any geometrical form that enables the splitting of the electromagnetic waves along opposing directions within the interior cavity. For example, the incoming electromagnetic waves may be split equally or substantially equally along two opposing directions in the interior cavity.

The electromagnetic waves may be distributed along the interior cavity resulting in the emission of electromagnetic from the continuous slit that forms an opening between the interior cavity and the plasma processing region of the process chamber. The continuous slit may also include a dielectric component that isolates the interior cavity from the process gases in the plasma processing region. The dielectric component may also be configured to modify or control the emission of the electromagnetic energy into the plasma processing region. For example, the surface of the dielectric component may be wavy in such a manner that enables a more uniform distribution of the electromagnetic energy within the plasma processing region. In other embodiments, the dielectric component may include pockets that vary the thickness of the dielectric component over discrete portions. The electromagnetic energy can be emitted into the plasma processing region based on the differences in thickness of the dielectric component. In this way, the electromagnetic energy uniformity within the plasma processing region may be controlled in one or more particular manners, depending on the geometry of the dielectric component and the microwave energy (e.g., power, frequency, etc.).

Another approach to control electromagnetic energy uniformity may be to vary the incoming microwave energy to the interior cavity. The variation may include, but is not limited to, phase angle shifting, frequency shifting, field rotation, pulsing, splitting (e.g., multiple power feeds into the interior cavity), or a combination thereof.

Generally, plasma density control for larger substrates may be difficult to accomplish. One approach may be to combine plasma sources to increase the control of the plasma density profile. For example, a plasma processing region may be serviced two or more plasma sources that are adjacent or proximate to the plasma processing region. In general, the power transmission element may be combined with other surface wave sources or magnetic sources to improve plasma density through the plasma processing region.

In one embodiment, the second plasma source may include a plasma rod source that propagates electromagnetic energy to dielectric rods that may protrude down into or towards the plasma processing region. In one instance, the plasma rod source may be opposite the substrate, while the power transmission element positioned around the perimeter of the substrate. In this way, the plasma rod source may influence plasma density near the center of the substrate, while the power transmission element may more strongly influence plasma density near the edge or perimeter of the substrate.

In another embodiment, a magnetic plasma source may be disposed above or below the power transmission element relative to the substrate. The magnetic plasma source may be configured to improve plasma density uniformity across the plasma processing region in conjunction with the power transmission element. For example, the magnetic field emitted from the magnetic plasma source may be used to influence the plasma density profile (e.g., center-to-edge) for the substrate. In another embodiment, an electric pressure plasma source may be disposed above or below the power transmission element and/or above or below the substrate being processed. The electric pressure plasma source may be used in conjunction with the power transmission element to control plasma density across the substrate.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
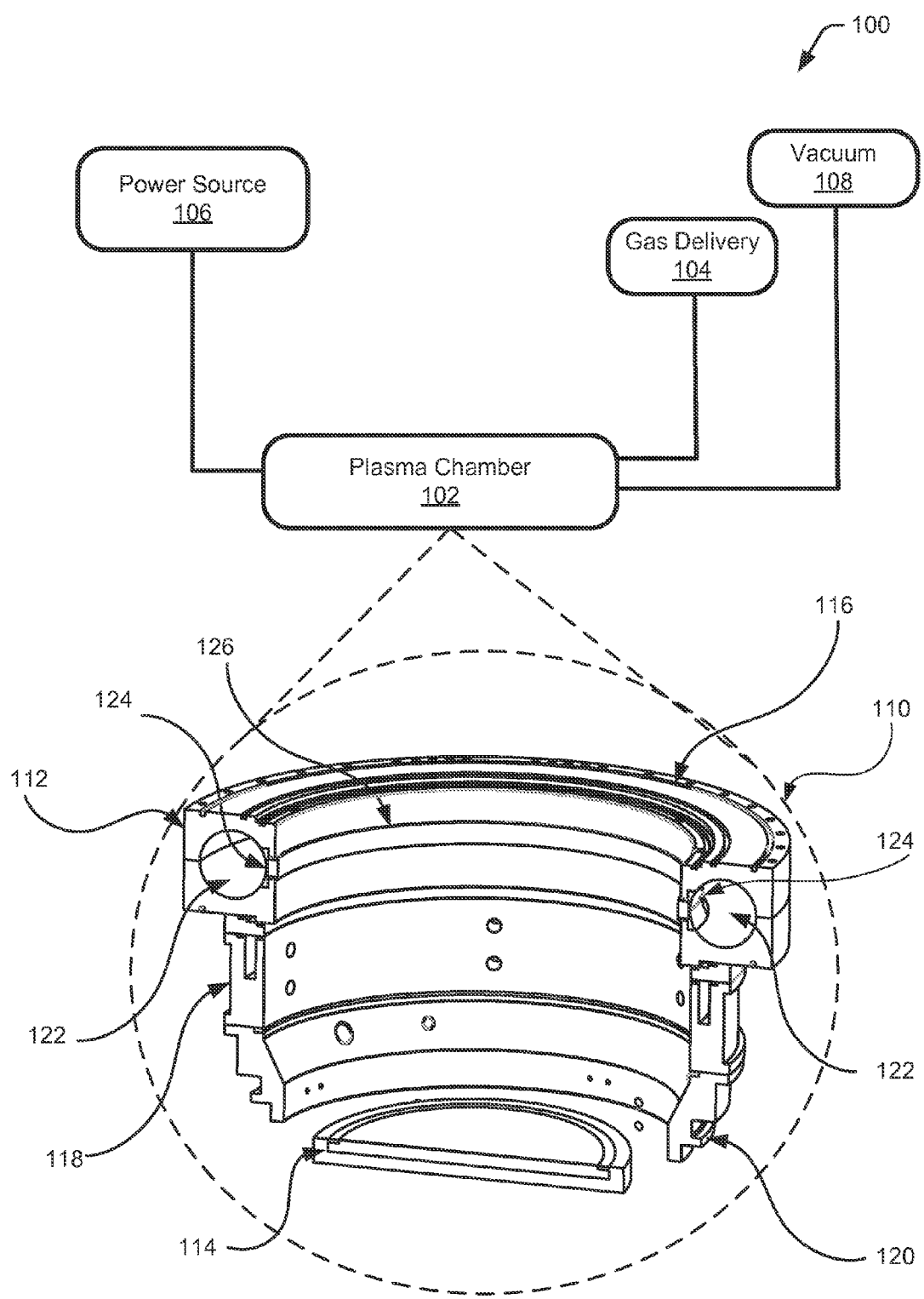
FIG. 1 is an illustration of a representative embodiment of a plasma processing system that shows a schematic cross-sectional illustration of one embodiment of a plasma chamber that includes a microwave power transmission element.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by a microwave power source 106. A vacuum system 108 may also maintain a sub-atmospheric pressure within the plasma chamber 102 during plasma generation.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas increase the density of ionized molecules within the gas, such that the ionized molecules may be influenced by potential differences within the plasma chamber 102. For example, the potential differences within the plasma chamber 102 may direct the ionize molecule towards a substrate (not shown). The ionized molecules (not shown) may interact with the substrate or treat the substrate in a way that may remove a portion of the substrate or may be deposited unto the substrate. In this way, patterns may be etched into the substrate or films may be deposited onto the substrate.

Plasma density across the plasma chamber 102 may impact the uniformity of the plasma treatment of the substrate. The plasma density may be a measure of ion density within a volume of the plasma within the plasma chamber 102. Plasma processing uniformity may be impacted when the plasma density varies across the substrate such that higher plasma density at the center of the substrate may cause a higher etch rate than the etch rate at the edge of the substrate. Generally, this process non-uniformity may be the result of the placement of a power transmission element near the center of a circular substrate and/or by diffusion characteristics of the plasma. One approach to resolve the non-uniformity may be to locate the power transmission element near the edge or around the edge of the circular substrate. A detailed view 110 illustrates one embodiment of this approach in the plasma chamber 102.

In one embodiment, the plasma chamber 102 may include a power transmission element 112 that may surround a substrate holder 114 that can support a substrate during plasma processing. Plasma generation may occur within the plasma chamber 102 that may include a O-ring seal 116 for a top cover plate that may cover the top of the plasma chamber 102 or another chamber attached to the top of the plasma chamber 102, an upper side wall 118, and a lower side wall 120. In other embodiments, the plasma chamber 102 enclosure may vary in size and orientation such that the substrate holder 114 may be closer to the power transmission element 112 than as shown in FIG. 1.

The power transmission element 112 may include an interior cavity 122 that may be coupled to the power source 106. In the FIG. 1 embodiment, the power transmission element 112 forms a circle around the plasma processing region or the substrate holder 114. Hence, the interior cavity 122 may propagate electromagnetic energy (not shown) around the plasma processing region or the plasma chamber 102 enclosure. The electromagnetic energy may be transmitted into the plasma chamber 102 enclosure from a continuous slit 124 that forms an opening between the interior cavity 122 and the plasma chamber 102. The continuous slit 124 may include a dielectric component 126 that isolates the interior cavity 122 from the gas in the plasma chamber 102. However, the properties of the dielectric component 126 enables electromagnetic energy to be transmitted into the plasma chamber 102 from the interior cavity 122. The interior cavity 122, the continuous slit 124, and the dielectric component 126 will be described in greater detail in the descriptions of the remaining figures.

Figure 2:
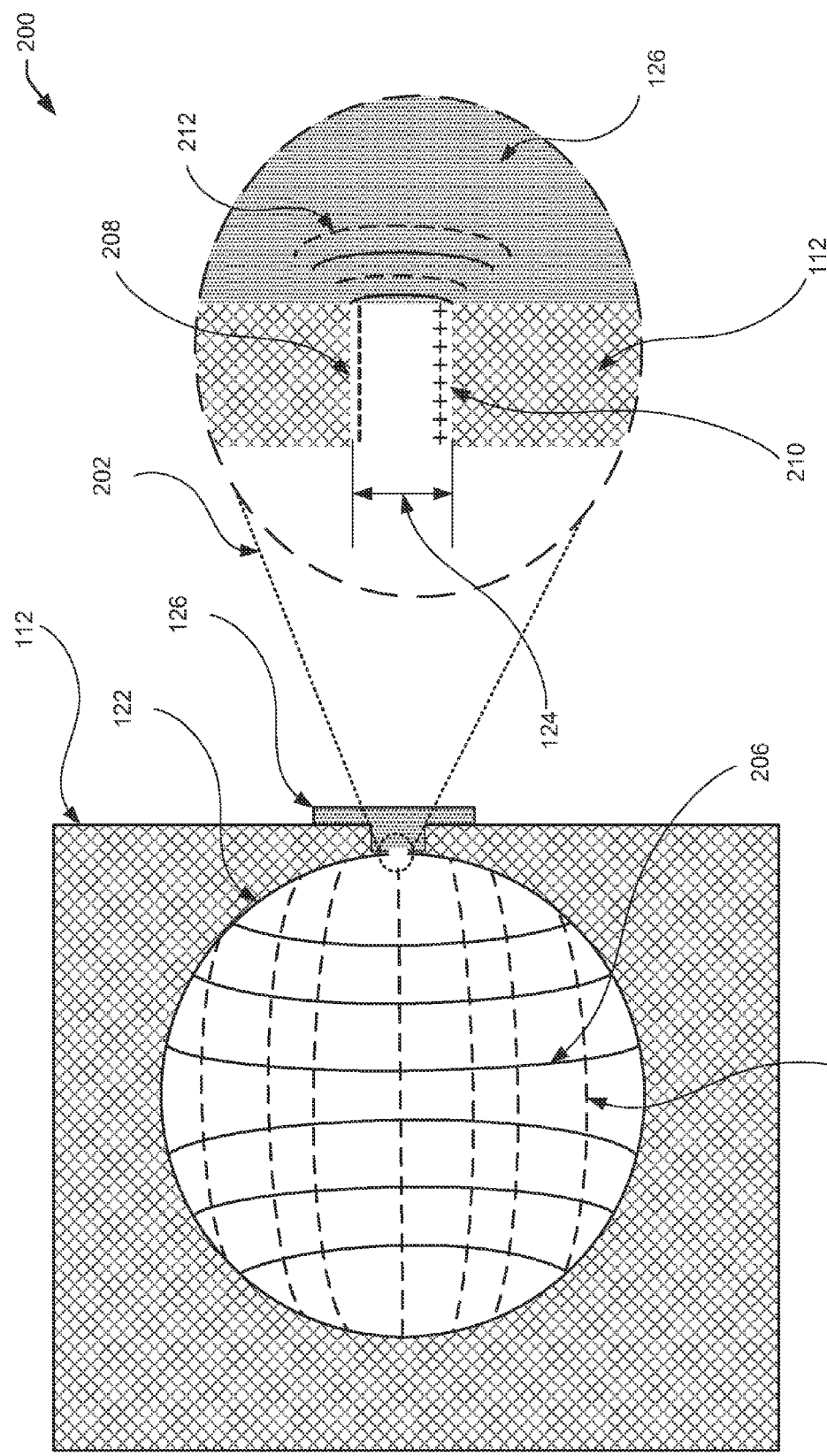
FIG. 2 is an illustration of a cross section of an exemplary interior cavity and continuous slit of a power transmission element and a representation of the electromagnetic energy transmitted through the interior cavity and emitted from the continuous slit.

The power source 106 may include, but is not limited to, a magnetron capable of generating electromagnetic energy in the radio frequency (RF) or microwave spectrum. The microwave spectrum may include electromagnetic waves with wavelengths ranging between 1 mm and 1 m and a frequency ranging between 300 MHz and 300 GHz. The RF spectrum may include electromagnetic waves with wavelengths ranging between 1 mm and 1 m and a frequency ranging between 300 kHz and 300 GHz. As shown in FIG. 2, the electromagnetic energy may be propagated through the interior cavity 122 to generate an alternating potential across the continuous slit 124 that may generate an electric field (not shown) that is emitted into the plasma chamber 102.

FIG. 2 is a cross-sectional illustration 200 of an exemplary interior cavity 122 and continuous slit 124 of a power transmission element 112. The illustration 200 also depicts a representation of the electromagnetic energy transmitted through the interior cavity 124 and emitted from the continuous slit 124 through the dielectric component 126. The exploded view 202 of the continuous slit 124 and dielectric component 126 is intended to explain the transmission of electromagnetic energy from the power transmission element 112 into the plasma chamber 102 enclosure.

The illustration 200 is intended to represent a static two-dimensional representation of electromagnetic energy comprising a magnetic field 204 and an electric field 206 in a transverse oscillating wave (not shown) propagating through the interior cavity 122 (e.g., propagating out of the FIG. 2 page). The dashed substantially horizontal magnetic field lines 204 represent the oscillation of the magnetic field as it propagates through the interior cavity 122. The solid substantially vertical electric field lines 206 represent the oscillation of the electric field as it propagates through the interior cavity 122.

The electromagnetic wave propagation through the interior cavity 122 may induce a potential difference across the continuous slit 124. For purposes of explanation, a negative charged surface 208 may be formed on the upper portion of the continuous slit 124 and a positively charged surface 210 on the lower portion of the continuous slit 124. However, the potential difference across the continuous slit 124 may also oscillate as the surface charge changes in concert with the change in current flow. The potential difference may generate an electromagnetic field 212 that may propagate through the dielectric component 126 and into the plasma chamber 102. The energy from the electromagnetic field 212 may separate electrons from their respective gas molecules and form ionized molecules (e.g., plasma) that may be used to treat the substrate.

In the FIG. 2 embodiment, the interior cavity 122 cross section is shown as circular. However, in other embodiments the cross section geometry of the interior cavity can vary in structure and size. For example, the interior cavity 122 cross section may be square or rectangular. Regardless of cross section geometry, the principles of electromagnetic propagation may still apply, but the geometry may impact the characteristics or power peak of the electromagnetic wave propagating in the interior cavity 122 and the electromagnetic field 212 transmitted into the plasma chamber 102. A rectangular embodiment will now be described in the description of FIG. 3.

Figure 3:
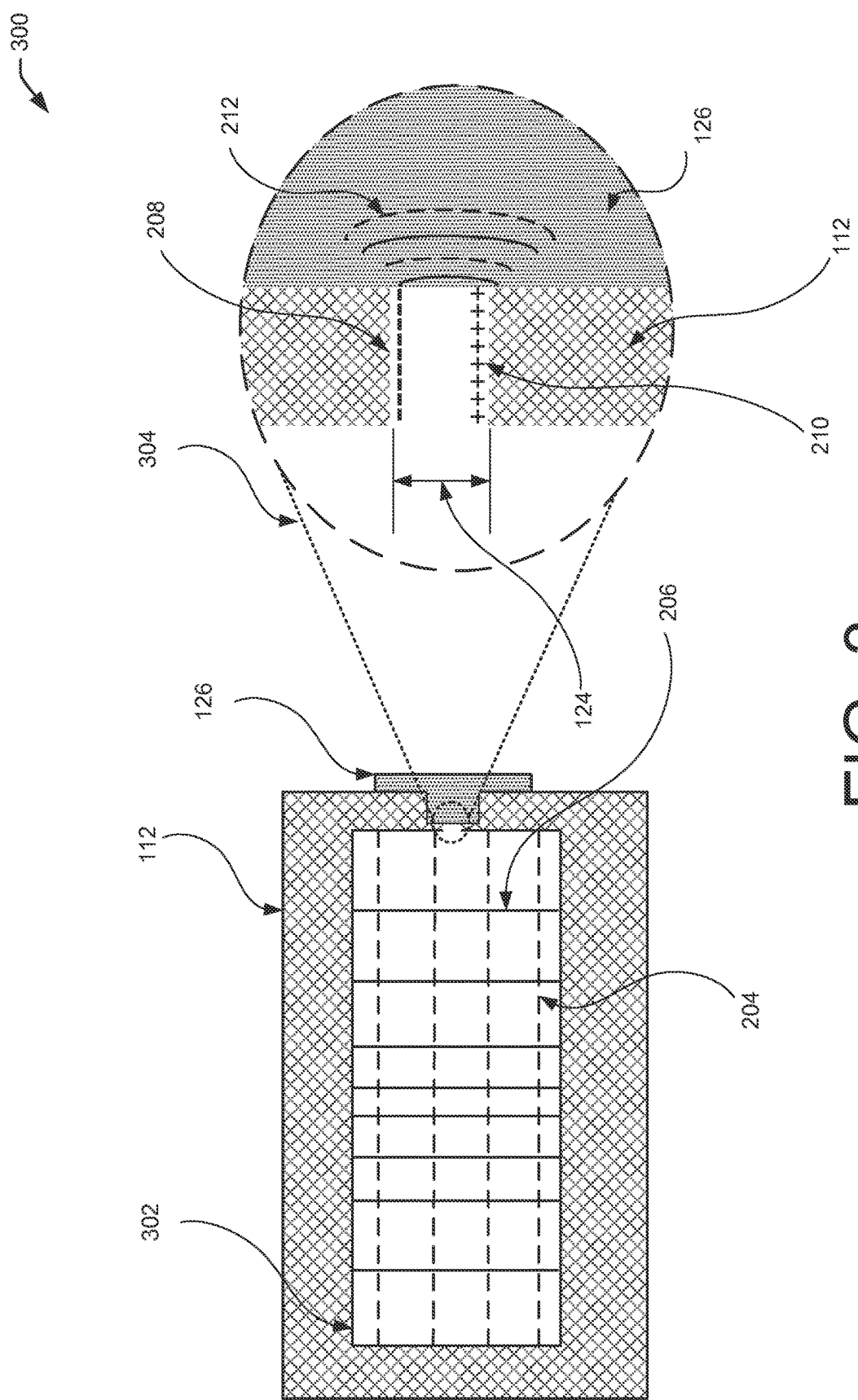
FIG. 3 is another illustration of a cross section of another exemplary interior cavity and continuous slit of a power transmission element and a representation of the electromagnetic energy transmitted through the interior cavity and emitted from the continuous slit.

FIG. 3 is a cross-sectional illustration 300 of a rectangular interior cavity 302 and continuous slit 124 of a power transmission element 112 along with a representation of the electromagnetic energy transmitted through the interior cavity 302 and emitted from the continuous slit 124. Again, the power source 106 may be coupled to the interior cavity 302 and propagate electromagnetic energy as represented by the magnetic field lines 204 and the electric field lines 206. Consequently, the oscillating potential difference across the continuous slit 124 may generate an electromagnetic field 212 that may be transmitted through the dielectric component 126 and into the plasma chamber 102 enclosure. The exploded view 304 of the continuous slit 124 and dielectric component 126 is intended to explain the transmission of electromagnetic energy 212 from the power transmission element 112 into the plasma chamber 102 enclosure.

Figure 5A:
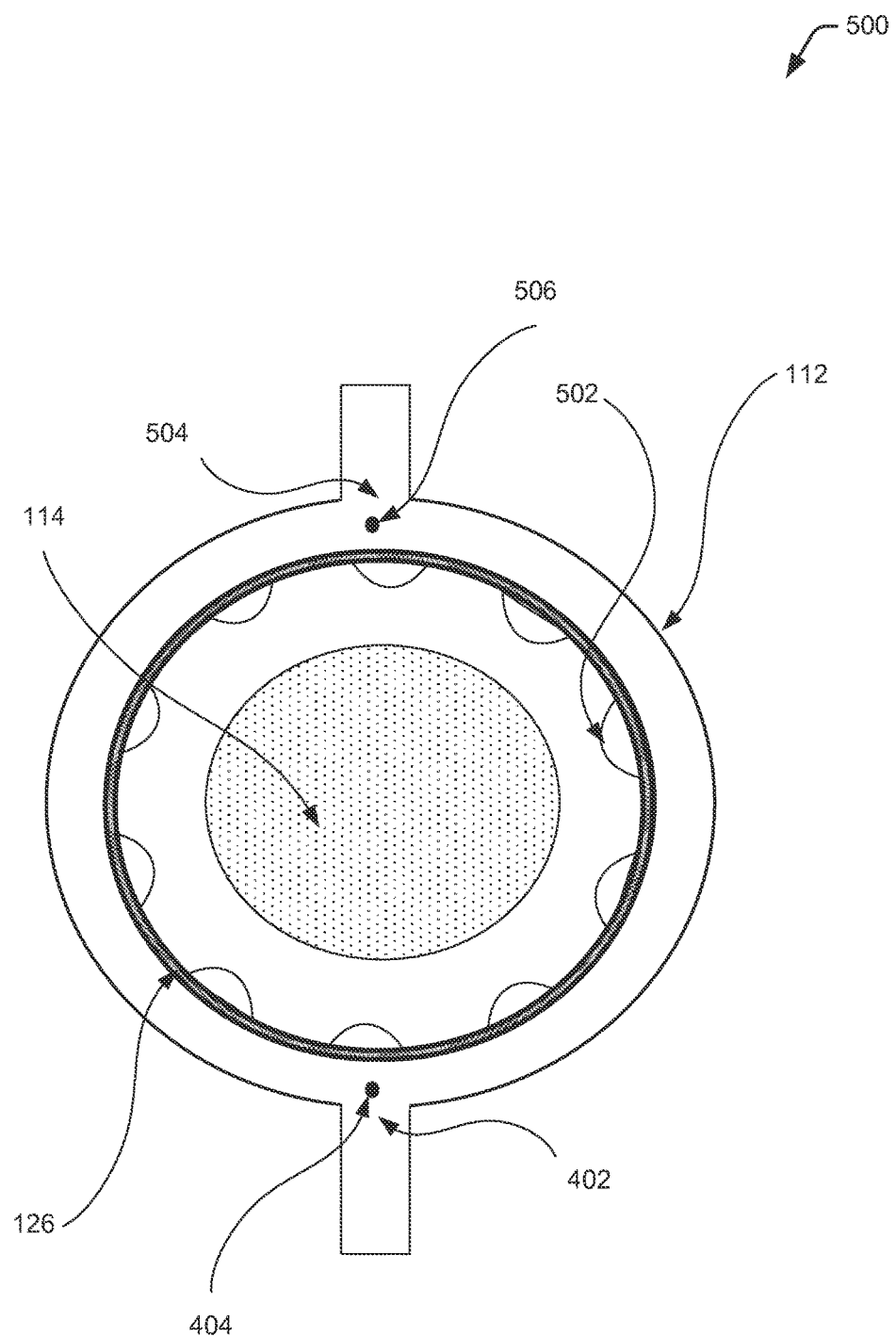
FIG. 5A is a top view illustration of the plasma chamber shown in FIG. 1 that includes dual power feeds that are connected to the interior cavity of the power transmission element and illustrates the electromagnetic energy emitted from the power transmission element.

FIG. 3 is intended to show that the electromagnetic wave propagation is not limited to a specific geometry for the interior cavity. The geometry may be circular (as shown in FIG. 2), rectangular, square, or any other geometric shape that may include a one or more continuous slits 124 that provide an opening between the interior cavity 302 and the plasma chamber 102 enclosure. In this way, the power transmission element 112 may enable a distribution of electromagnetic energy throughout the plasma chamber 102. The circular power transmission element 112 is merely one energy distribution embodiment, as shown in FIG. 5A.

One aspect of the power transmission element 112 that may also influence plasma density uniformity is the distribution of electromagnetic energy that may be received into the interior cavity 122. Generally, the more uniform the distribution of the electromagnetic energy may increase the uniformity of the plasma within the plasma processing region. However, the electromagnetic energy may be received into the interior cavity at one or more distinct points, which may result in higher plasma densities proximate to, adjacent to, or opposite those distinct points. One approach to resolve this issue may be to divide or split the electromagnetic energy in opposing directions through the interior cavity 122.

Figure 4:
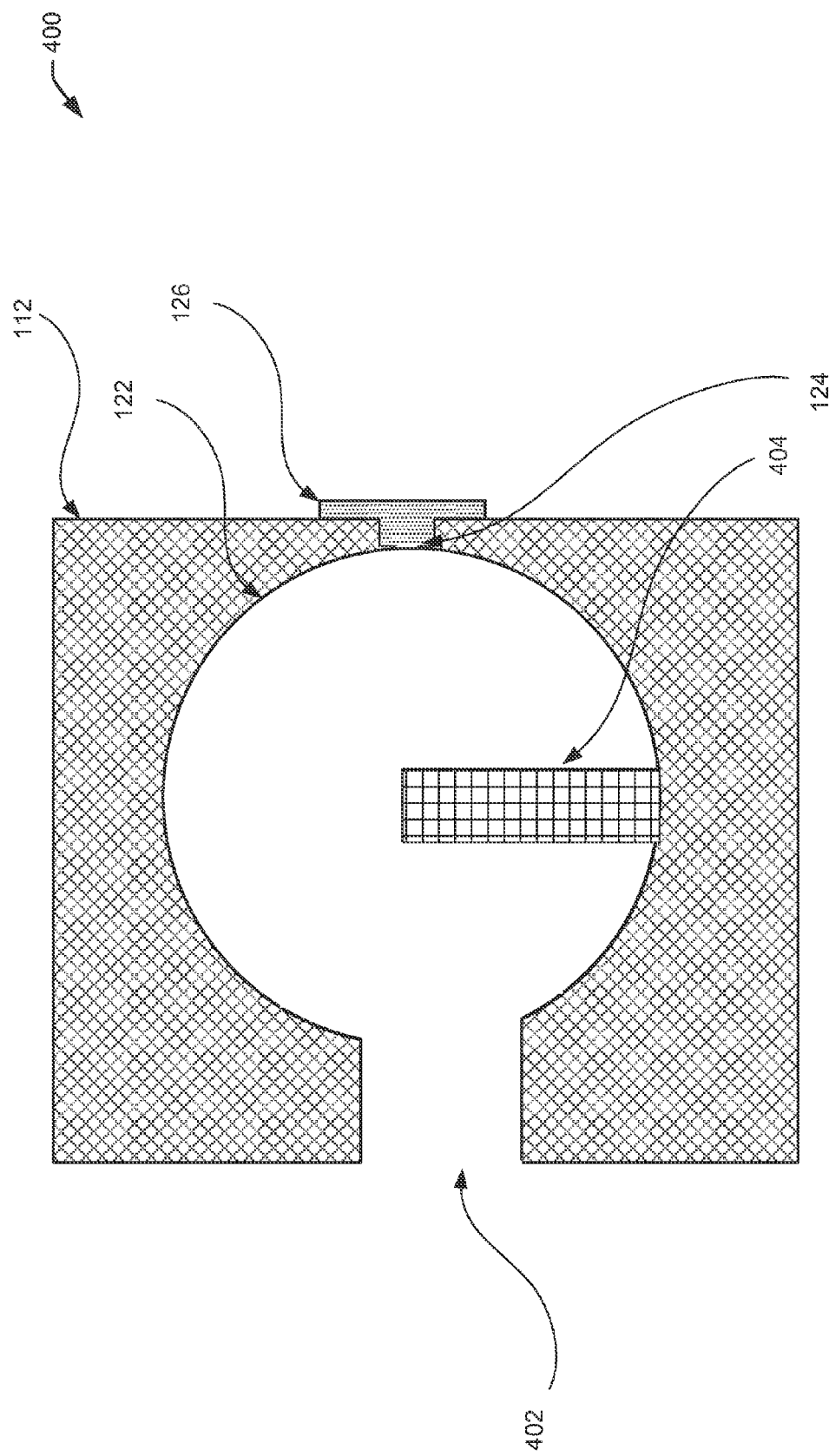
FIG. 4 is another illustration of a cross section of another exemplary power transmission element that includes an interior cavity, slit, and a power distribution element.

FIG. 4 illustrates a cross section 400 of another exemplary power transmission element 122 that includes an interior cavity 122, slit 124, dielectric component 126, a power feed 402, and a power distribution element 404. The FIG. 4 embodiment is representative of a single embodiment with respect to the arrangement of the power feed 402 and the power distribution element 404. In this embodiment, the power feed is opposite the slit 124, but in other embodiments, the power feed may be rotated to an off-angle from the slit 124. For example, in one specific embodiment, the power feed 402 may be rotated ninety degrees from the center of the interior cavity 122, such that the power feed 402 would be positioned at the top or bottom of the interior cavity 122 shown in FIG. 4. In many instances, the power distribution element 404 may be positioned opposite the power feed 402 and may be rotated or positioned in a similar arrangement when the power feed 402 is in another position not shown in FIG. 4. However, the power distribution element 404 may not be required to be moved in a completely similar manner as the power feed 402. Also, the interior cavity 122, as shown in FIG. 4, is not limited to the circular embodiment and may include rectangular designs, as shown in FIG. 3.

The power feed 402 may include any type of opening that enables the transmission of electromagnetic energy from the power source 106, via a wave guide (not shown), to the interior cavity 122. The power feed 402 opening may be between the interior cavity 122 and the exterior surface of the power transmission element 112. The opening may enable electromagnetic energy to enter the interior cavity 122 from the wave guide (now shown).

The power feed 402 may include, but is not limited to, a straight feed or a horn feed or a tapered feed. The straight feed may be flush or substantially flush with the interior cavity 122, while the horn/tapered feed may angled or tapered wall structure proximate to the power feed opening. For example, the power feed 402 into the interior cavity 122 may be tapered up to 45 degrees. The shape of the power feed 402 opening into the interior cavity 122 may be circular, substantially circular, rectangular, or square. In the circular embodiment, the diameter of the power feed 402 opening may be up to 100 mm. In the rectangular embodiment, the length of the rectangular opening may vary up to 150 mm and the height of the rectangular opening may vary up to 150 mm. However, the length or the height may not be equal in order to maintain a rectangular configuration. The square embodiment will be in a similar manner as the rectangular embodiment; however each of the four sides of the opening will have the same or similar lengths. As noted above, the electromagnetic energy may pass through the power feed 402 into the interior cavity 122. Generally, the interior cavity 122 may be formed such that the incoming electromagnetic energy may not be aligned with the path of the interior cavity 122. Accordingly, the distribution of the electromagnetic energy along the interior cavity 122 may be non-uniform to the degree that plasma density uniformity within the plasma processing region may difficult to maintain. One approach to improve uniformity may be to divide the incoming electromagnetic energy and direct the energy along the interior cavity 122 in a more uniform manner. In one embodiment, a power distribution element 404 may be placed in the interior cavity 122 opposite the power feed 402.

The power distribution element 404 may be any physical object with a geometry that enables the dividing or splitting of the incoming electromagnetic waves to the interior cavity 122 to be directed along opposing directions within the interior cavity 122. Broadly, the power distribution element 404 may include a rod extending across the interior cavity 122. The rod having any cross sectional of, but not limited to, circular, rectangular, triangular, semi-circular, oblong, or a chamfered version of any of the aforementioned cross sections. In one specific embodiment, the power transmission element 303 may be a circular rod that has a diameter of at least 20 mm and a length of up to 60 mm, with a preferred length of approximately 40 mm. In certain embodiments, the power transmission element may be actuated or moved to vary the length during or between plasma processing. In another embodiment, the diameter of the power distribution element 404 may be less than 30 mm, with length or diameter across the interior cavity or up to 80 mm.

In a rectangular embodiment, the power transmission element 404 may be rotated to expose a different length to the incoming electromagnetic energy, such that the long side or the short side may be used to divide the electromagnetic energy.

In another embodiment, the power transmission element 404 may also vary the lateral distance within the interior cavity 122. For example, the position may vary between the slit 124 and the power feed 402. In certain instances, the power transmission element 404 may be disposed equidistant from the slit 124 and the power feed 402. But, in other instances, the power transmission element 404 may be disposed closer to the slit 124 or the power feed 402. In one specific embodiment, the distance between the slit 124 and power feed 402 may be varied during processing to tune or adjust the uniformity of the electromagnetic energy within the interior cavity 122 or the plasma uniformity within the plasma processing region.

In the power distribution element embodiments above, the configuration of the power distribution elements 404 may also be designed to enable impedance matching between the power source 106 and the plasma processing region. Typically, the geometry or size of the power distribution element 404 may also be adjusted in any way to enable impedance matching. Further, the power transmission element 404 may also be adjusted to accommodate the frequency and magnitude of the incoming electromagnetic energy with respect to uniformity within the interior cavity 122 or the plasma processing region.

Uniformity may also be impacted by the amount and location of the power feeds 402 for the interior cavity 122. Two or more power feeds 402 may be used in a complementary way control plasma uniformity within the plasma processing region. Broadly, the phase angle, field angle, frequency, and/or the magnitude may be varied between the two or more power feeds 402.

FIG. 5A is a top view illustration 500 of the plasma chamber 102 that does not include the top plate for the purpose of showing the structure of the power transmission element 112 relative to the substrate holder 114 and the electromagnetic energy (e.g., electromagnetic field 212) emitted from the dielectric component 126. In this embodiment, the power transmission structure 112 may be formed around the substrate holder 114 or a plasma processing region proximate to the substrate holder 114. The power transmission element 112 may be circular or substantially circular (e.g., round or elliptical) to provide an electromagnetic field 502 that may ionize gas that is introduced into the plasma chamber 102. The gas may be introduced above, below, or above and below the power transmission element 112.

The distribution of the pattern of the electromagnetic field 502 may be driven by, but is not limited to, transverse electric power peaks (TE), transverse magnetic power peaks (TM), transverse electromagnetic power peaks (TEM), or hybrid power peaks. The power peaks are used to classify or identify the types of the electromagnetic waves based on a plane that is perpendicular to the propagation direction of the wave (e.g., electric or magnetic). TE waves are electromagnetic waves that do not have an electric field in the direction of propagation. TM waves are electromagnetic waves that do not have a magnetic field in the direction of propagation. TEM waves are electromagnetic waves that do not have an electric or magnetic field in the direction of propagation.

Waves may also be classified by the type and the number of power peaks in their pattern, such as $TE_{11}$ or $TE_{10}$. The lower field strength regions may be responsible for the lower magnitude portions of the electromagnetic field 502 and are illustrated, in the top view, by the oscillation of electromagnetic field 502 around the power transmission element 112. The lower field strength may be represented by the portion of the electromagnetic field 502 that is closest to the dielectric component 126, as shown in the top view illustration 500. Although one power peak is illustrated in FIG. 5A, the power transmission element 112 is not limited to any pattern or number and may be used to propagate any of the patterns and associated variations.

In addition to the uniformity factors (e.g., power distribution element 404, etc.) noted above, the uniformity of the electromagnetic field 502 may also be influenced by the interaction of two or more electromagnetic waves being introduced into the interior cavity 122 at the same or similar time. One way to implement this embodiment is to have a first power feed 402 and a second power feed 504 to the power transmission element 112.

The interior cavity 122 may include a first power feed 402 and a second power feed 504 that can provide electromagnetic energy to the interior cavity 122 that may be distributed along the interior cavity 122 using a first power distribution component 404 and a second power distribution component 506. When the electromagnetic energy is provided to the interior cavity 122 with the same phase angle, the magnitude of the electromagnetic field 502 may be increased in a corresponding way. For example, the magnitudes from each electromagnetic wave transmitted through the interior cavity 122 may be combined or added to generate an electromagnetic field 502 that has a higher magnitude than by each electromagnetic wave separately. In the FIG. 5A embodiment, the two electromagnetic waves may have 10 power peaks that overlap to generate a corresponding electromagnetic field 502 with 10 power peaks with a magnitude that is greater than each of the individual electromagnetic waves received at the first power feed 402 and the second power feed 504. Accordingly, the magnitude of the electromagnetic field 502 may vary with magnitudes changes in either of the incoming electromagnetic waves from the power feeds (e.g., first power feed 402, second power feed 504).

The characteristics of the incoming electromagnetic waves to the first power feed 402 and the second power feed 502 may be adjusted in a variety of ways that may alter the distribution and magnitude of the electromagnetic field 502. One approach to vary the distribution of the electromagnetic field 502 may include altering the phase angle of the incoming electromagnetic waves. This approach will be discussed in greater detail in the description of FIG. 5B. One approach to vary or modify the magnitude of the electromagnetic field 502 may be to vary the orientation of the field of the electromagnetic waves. This approach will be discussed in greater detail in the description of FIG. 6. Generally, the incoming electromagnetic waves may be provided as a continuous wave. However, pulsing the frequency, duty cycle, power level, or combination thereof can extend the operating range, uniformity, and stability of the electromagnetic field 502. For example, during multiple processing steps the source loads may vary and pulsing may be used to alter the wave form to maintain the desired effective power to the plasma processing region.

The pulsing of the electromagnetic waves may include, but is not limited to, a frequency range of 1 kHz to 100 kHz, magnitude of 500 W to 5 KW, and a duty cycle of 10% to 90%, such that resonance and uniformity of the electromagnetic waves can be maintained or optimized during plasma processing. For example, in one instance, pulsing a 1500 W electromagnetic wave by changing the duty cycle, for a fixed frequency, may enable generating an electromagnetic wave between 100 W to 1500 W. This may enable a more stable and uniform plasma by not ramping up and down the power source 106 to different magnitudes and provide faster response to varying load conditions.

Figure 5B:
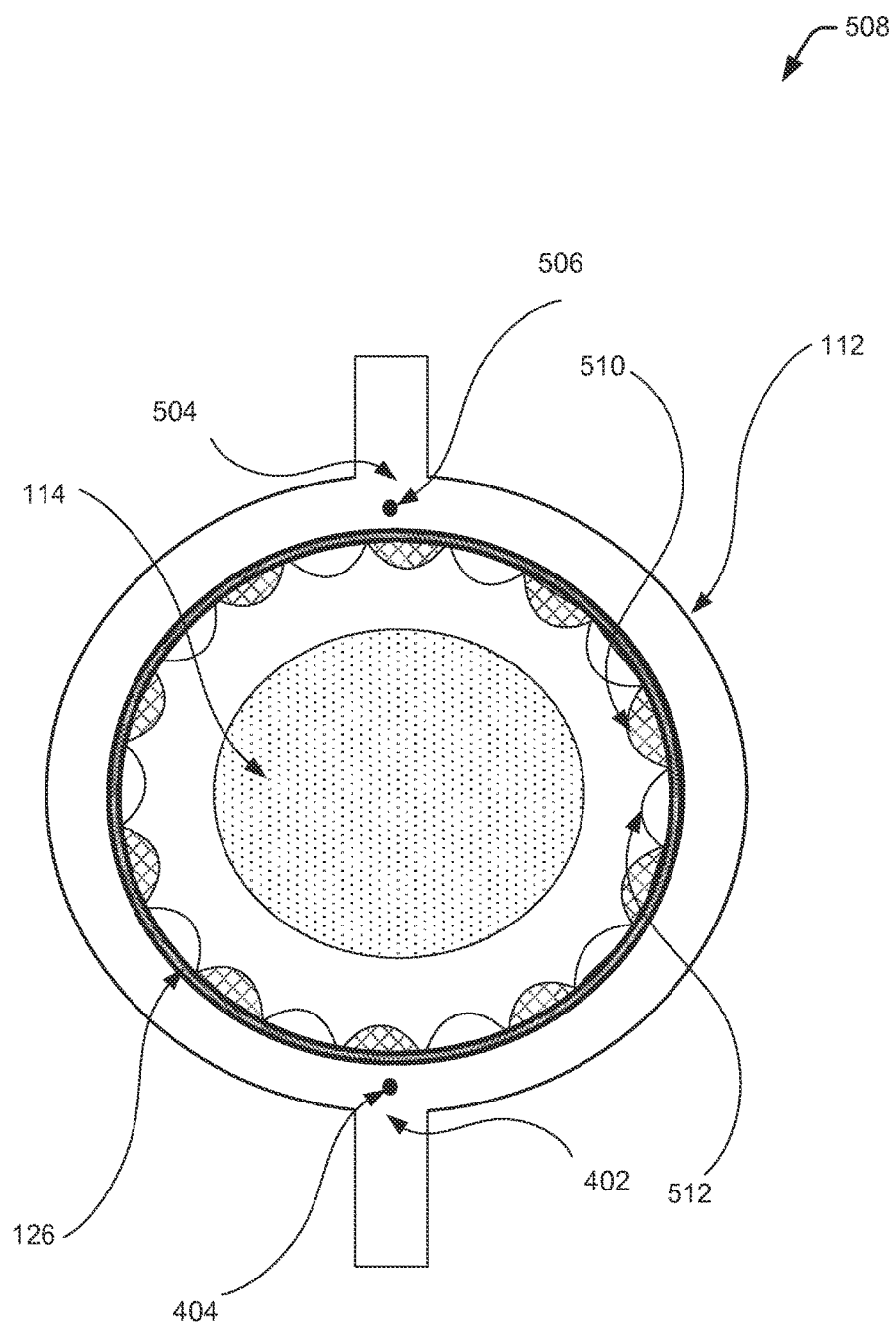
FIG. 5B is a top view illustration of the plasma chamber shown in FIG. 1 that includes dual power feeds that receive electromagnetic waves with different phase angle that are provided to the interior cavity of the power transmission element and illustrates the electromagnetic energy emitted from the power transmission element.

FIG. 5B is a top view illustration 508 of the plasma chamber 102 that does not include the top plate for the purpose of showing the structure of the power transmission element 112 relative to the substrate holder 114 and the electromagnetic energy (e.g., electromagnetic fields 510, 512) emitted from the dielectric component 126. As noted above, the power transmission structure 112 may be formed around the substrate holder 114 or a plasma processing region proximate to the substrate holder 114. The power transmission element 112 may be circular or substantially circular (e.g., round or elliptical) to provide electromagnetic field that may ionize gas that is introduced into the plasma chamber 102. The gas may be introduced above, below, or above and below the power transmission element 112. In contrast to FIG. 5A, the embodiment illustrated in FIG. 5B relates to providing a first electromagnetic wave with a first phase angle to the first power feed 402 and providing a second electromagnetic wave with a second phase angle to the second power feed 504. In this way, plasma may be generated by the emission of the first electromagnetic field 510 and the second electromagnetic field 512 into the plasma processing region. In the FIG. 5B embodiment, the phase angle difference between the first electromagnetic field 510 and the second electromagnetic field 512 may be ninety degrees. In this way, the energy (as shown in the increased number of wave patterns) may be distributed more uniformity over the chamber in contrast to the distribution of the energy or wave patterns (number of wave) shown in FIG. 5A when the two electromagnetic waves have the same or similar phase angle. The broader energy distribution shown in FIG. 5B may provide a higher resolution for tuning plasma density in localized areas of the plasma processing region. The tuning of the localized regions may also be further enabled by continuous phase angle shifting between the two or more incoming electromagnetic waves. As noted above, pulsing and duty cycle adjustment of the incoming electromagnetic waves may also improve plasma stability and uniformity within the plasma processing region. These techniques alone, or in combination, may enable low power plasma processing down to 100 W.

In other embodiments, the phase angle difference between the incoming electromagnetic waves may also be, but is not limited to, 180 degrees or 270 degrees. The number of incoming electromagnetic waves may also be greater than two and each of those incoming electromagnetic waves may have a different phase angle.

Although FIGS. 5A and 5B illustrate the first power feed 402 and the second power feed 504 in a horizontal manner that is opposite the slit 124. However, in other embodiments the feeds may be arranged at the top of the interior cavity 122 with the power distribution elements (404, 506) being moved to opposite their respective incoming power feeds (404, 506). In circular interior cavity 122 embodiments (e.g., FIG. 2), the incoming power feeds may be at any angle around the interior cavity 122. In non-circular interior cavity 122 embodiments (e.g., FIG. 3) the incoming power feeds may be on the same or opposite planes of the interior cavity 122.

Another approach to vary the magnitude may include rotating the field of the electromagnetic waves to expose different portions of the field to the slit 124 and the plasma processing region. Or adjusting the interior cavity 122 relative to the slit 124 to expose different portions of the field to the plasma processing region. Rotating or repositioning the field may enable varying the magnitude of the electromagnetic waves. The magnitude of the field may vary at different portions of the field, which may be helpful making magnitude adjustments without varying the power source 106 directly, which may result in a more stable and uniform plasma.

Figure 6A:
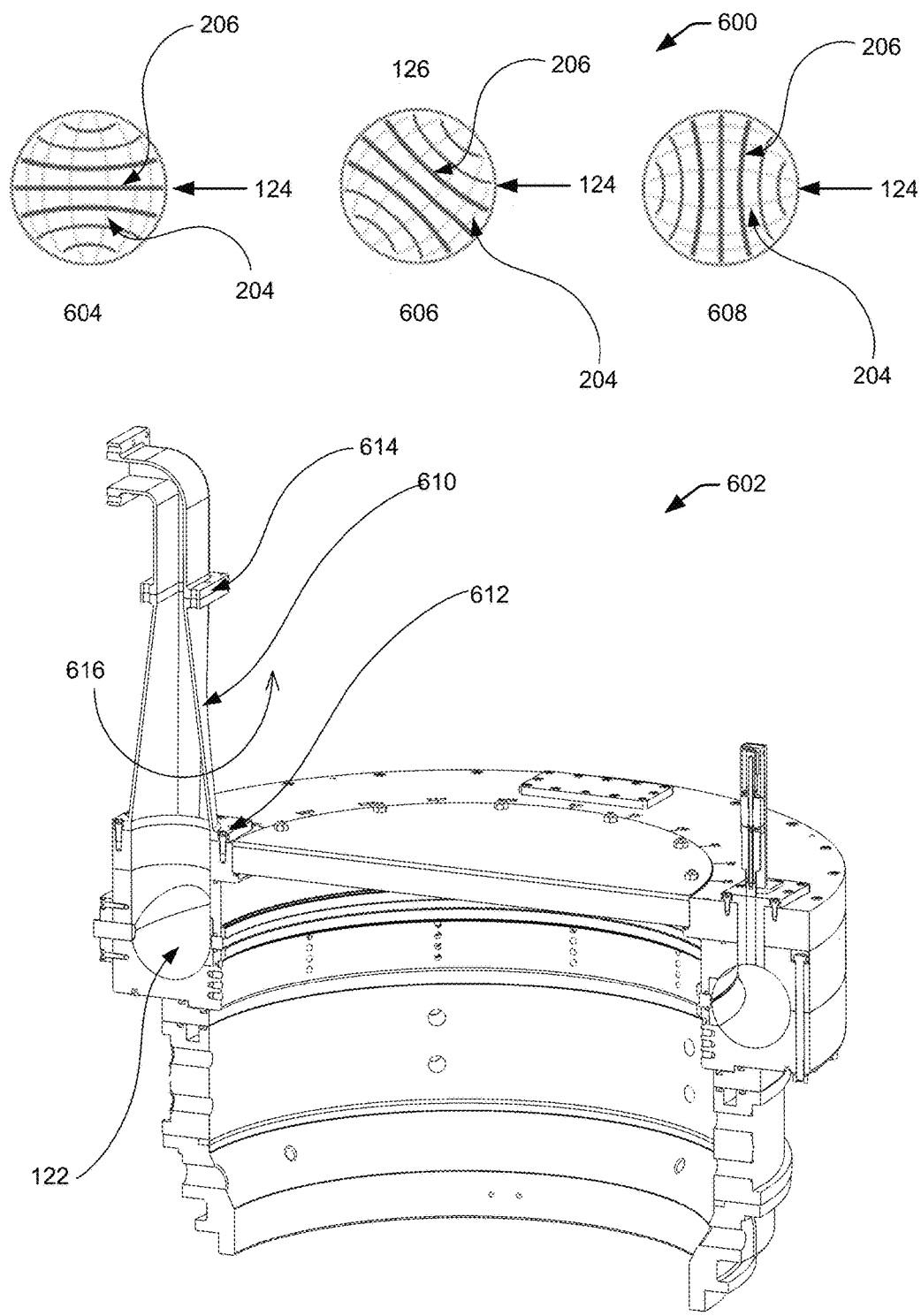
FIG. 6A includes an illustration of a rotational power feed embodiment and examples of the rotated fields implemented by the rotational power feed embodiment.

FIG. 6A includes an illustration 600 of examples of rotated fields for the electromagnetic waves and an illustration 602 of a rotational power feed 604 embodiment that may be used to rotate the field. Three field examples are shown with the orientation of their and magnetic fields 204 and their electric fields 206 that may propagate through the interior cavity 122 along with their relative orientation to the slit 124. The propagation of the electric field 206 through the slit 124 will be the smallest for the first field embodiment 604. The magnitude of the power transferred into the plasma processing region may be the smallest when for an electromagnetic wave generated with a certain power, frequency, and/or duty cycle. To increase the power into the plasma processing region, the field may be rotated as shown in the second field embodiment 606. For example, rotating the field by 45 degrees from the first field embodiment 604 to the second field embodiment 606. The maximum magnitude may be enabled by rotating the second field embodiment another 45 degrees so that the propagation of the electric field 206 may be substantially perpendicular to the slit 124 or more parallel to the surface of the interior cavity 122 than the previous field embodiments.

Figure 6B:
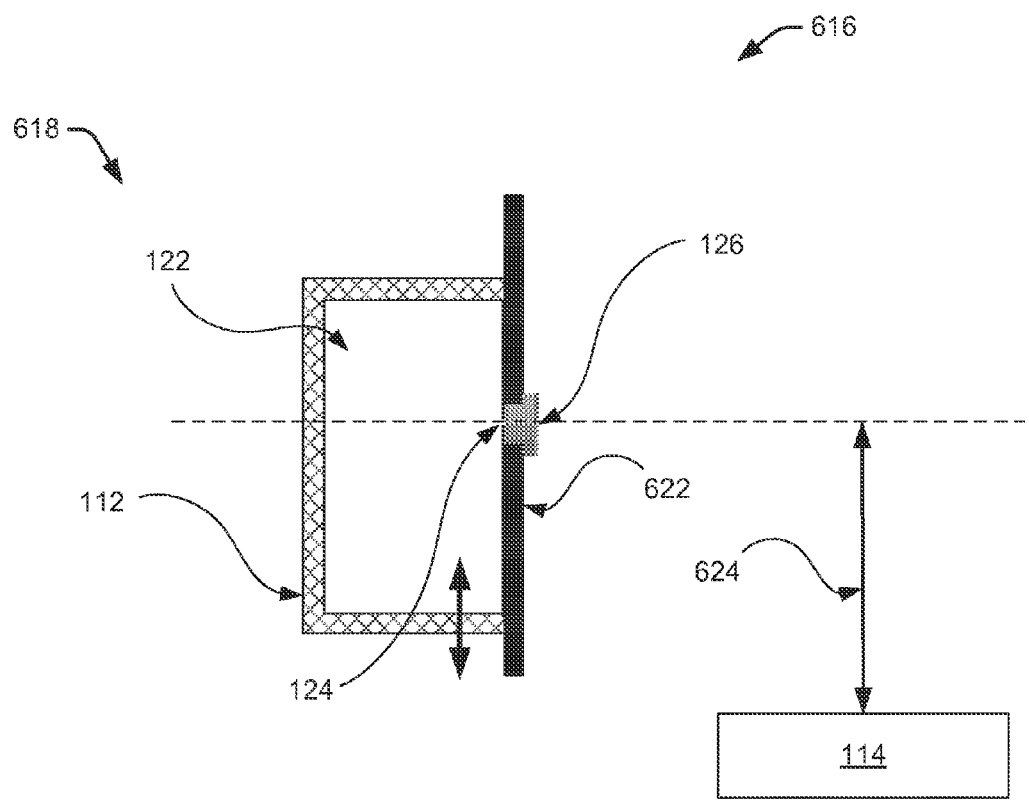
FIG. 6B is a two-dimensional cross section illustration of the power transmission element that can move relative to the power transmission slit of the interior cavity.
Figure 6B:
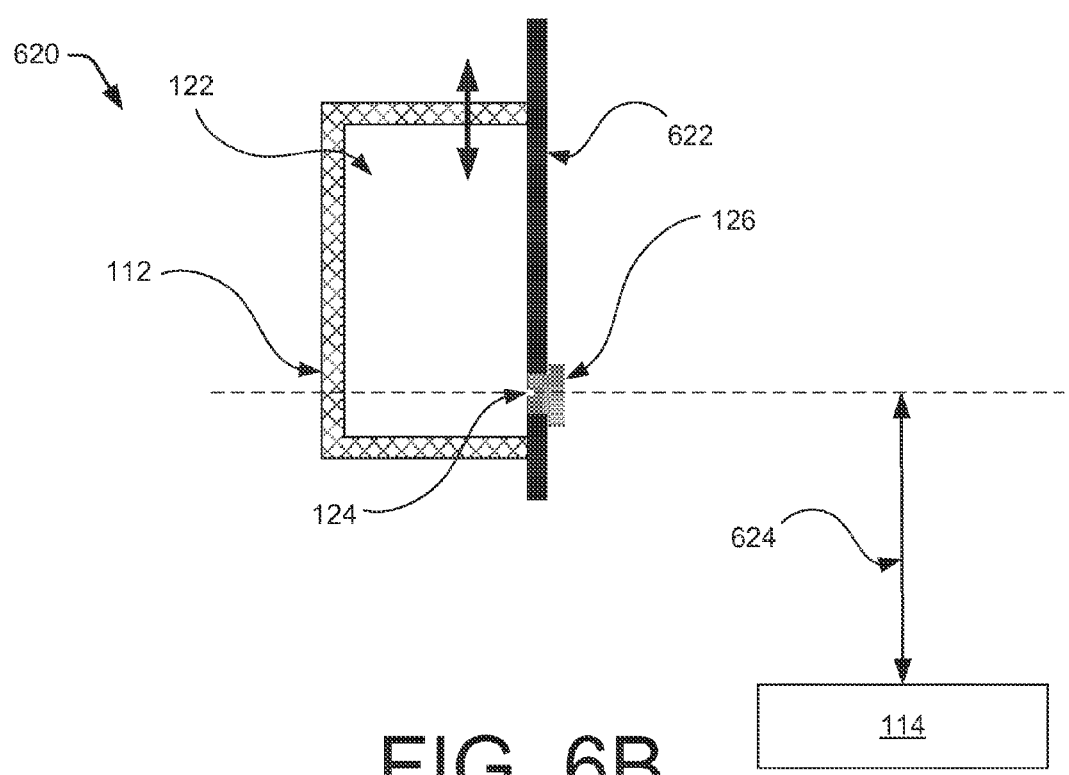

One approach to rotate the field may be implemented by rotating the waveguide prior to reaching the interior cavity 122, as shown in the cross section illustration 602 in FIG. 6B. The interior cavity 122 includes a top power feed that is coupled to a rotation waveguide 610 via a first rotation coupling 612 and coupled to the power source 106 via a second rotation coupling 614. The rotation waveguide 610 may rotate counter-clockwise direction 616 or a clock wise direction around a center line axis (not shown) through the rotation waveguide 610. The rotation angle may be static or dynamic during plasma processing. For example, the rotation waveguide 610 may be adjusted to different angles during different steps of a multi-step process. This could be done to adjust from higher to lower or lower to higher power setting during plasma processing. The rotation may be implemented by any known mechanical means known to a person of ordinary skill in the art.

Another approach to vary the power being emitted into the plasma processing region may include altering the position of the interior cavity 122 relative to the slit 124, such that the different portions of the exposed field that have different magnitudes that may be exposed to the plasma processing region.

FIG. 6B includes cross section illustrations 616 of the power transmission element 112 that can move relative to the power transmission slit 124 of the interior cavity 122. The different positions of the power transmission element 112 enable different power levels to be emitted towards the substrate 114 when propagating the same electromagnetic wave through the interior cavity 122. In each embodiment, the chamber wall 622 remains motionless as the power transmission element 112 may be moved expose a different portion of the propagating electromagnetic wave to the power transmission slit 124. This may achieve a similar result of varying the emitted power as rotating the field embodiment described in the description of FIG. 6B. In certain embodiments, the substrate offset distance 624 may be constant during processing. However, the substrate offset distance 624 may vary during or between process steps in other embodiments.

In the upper embodiment 618, the position of the power transmission element 112 may enable higher power transmission towards the substrate 114 than the power transmission element 112 shown in the lower embodiment 620 using the same electromagnetic wave. For example, a 1000 W electromagnetic wave propagating through the interior cavity may not emit the same power in all localized portions of the electromagnetic wave. Hence, in the upper embodiment 618, a first power may be emitted from the power transmission slit 124 towards the substrate 114. While, in the lower embodiment 620, a second power may be emitted from the power transmission slit 124 towards the substrate 114. For example, for a given 1000 W electromagnetic wave, the first power may be different than the second power due to the difference in position of the power transmission element 112 relative to the power transmission slit 124. As the slit 124 moves closer to the edge of the interior cavity, the magnitude of the transmitted power will be higher than when the slit 124 is closer to a center line (not shown) of the interior cavity 122. Hence, the lower embodiment 620 may emit a lower amount of power towards the substrate 114 than the configuration illustrated in the upper embodiment 618.

In addition to the embodiments described above, many other approaches may be used to vary or control the power and/or power uniformity within the plasma processing region. The outgoing power from the power source 106 may be conditioned or controlled in such a way that may increase power stability and uniformity within the interior cavity 122 and/or the plasma processing region. Broadly, one approach may be to introduce power at two or more points to the power transmission element 102 or to the plasma processing region, as described in the description of FIGS. 7A-7B. Another approach may be to condition at least one of those incoming electromagnetic waves using a phase shifter component to adjust the phase angle between the two or electromagnetic waves, as described in the description of FIGS. 8A-8B. In addition to splitting or phase angle shifting, the field of the electromagnetic waves may also be rotated prior to being received in the interior cavity 122, as described in the description of FIGS. 9A-9B.

Figure 7A:
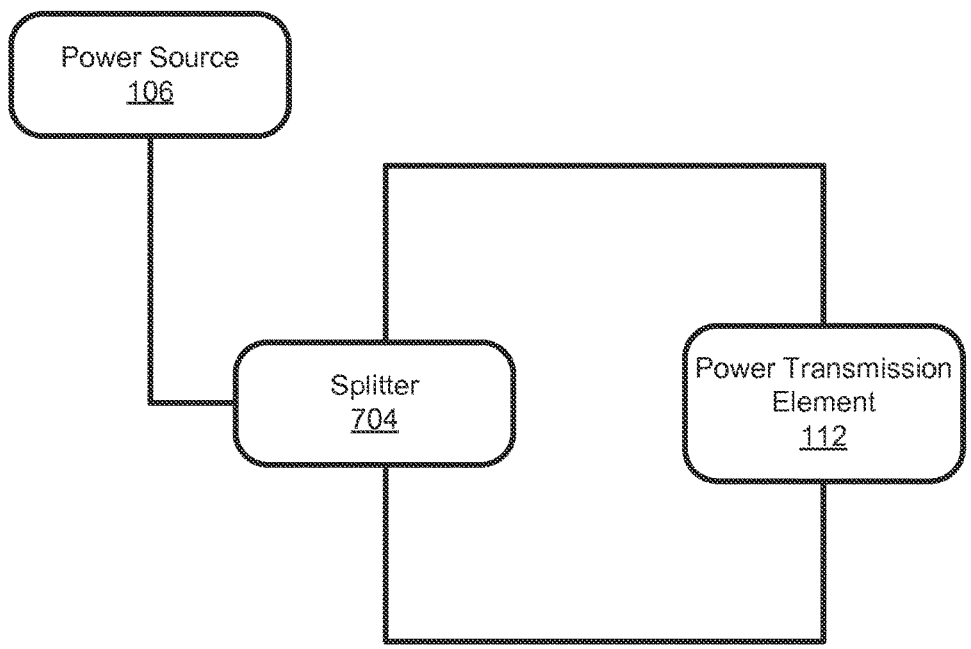
FIGS. 7A-7B includes schematic illustrations of a dual power feed configuration for a single plasma source process chamber and a dual plasma source process chamber.
Figure 7B:
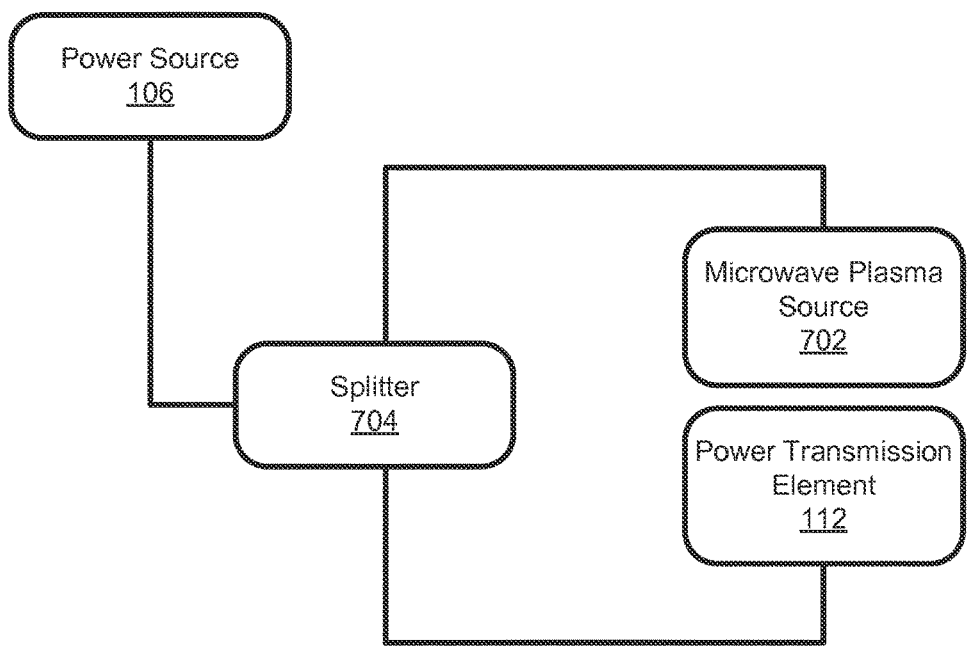

FIGS. 7A-7B includes schematic illustrations of a dual power feed configuration for a single plasma source process chamber that includes a power transmission element 112 and a dual plasma source process chamber that may include a power transmission element 112 and another microwave plasma source 702. In the FIG. 7A embodiment, the power source 106 may provide an electromagnetic wave that is split between two or more paths (e.g., waveguides) that are connected to different positions of the interior cavity 122. The splitter component 704 may divide the electromagnetic wave equally along the two or more paths using a simple T splitter that splits the incoming electromagnetic wave and directs the split waves along different paths. In this embodiment, the split electromagnetic waves may be connected to the interior cavity at positions around the interior cavity 112 and/or at different incoming angles to the interior cavity. For example, in the dual split embodiment shown in FIG. 7A, the incoming paths to the interior cavity 112 may be coupled to opposite ends of a circular interior cavity 112 or a set distance apart on a linear interior cavity (now shown). In the FIGS. 7A-7B embodiments, the electromagnetic waves may share the same frequency and/or power or the splitter component 704 may also adjust the frequency, phase, and/or power of the waves, such that the two or more waves may have different characteristics when they reach the interior cavity.

FIG. 7B illustrates another embodiment that incorporates the splitter component 704 to influence the plasma uniformity within the plasma processing region. In this instance, another microwave plasma source 702 may be included in the plasma chamber 102 configuration. In one embodiment, the microwave plasma source 702 may be disposed opposite of the substrate 114 and adjacent to a circular power transmission element 112. In this way, the microwave plasma source 702 may be used to influence the plasma density within the center region of the circular power transmission element 112. In essence, the dual plasma sources may be balanced together in a way that achieves a desired plasma density profile in the plasma processing region. For example, the dual sources may be used to achieve a relatively flat profile, a high center and low edge profile, or a low center and high edge profile. In certain instances, the profile may be shifted between substrates or within the processing of a single substrate (e.g., semiconductor substrate). One example of the microwave plasma source may include, but is not limited to, a dielectric pole source described in the description of FIG. 10.

Figure 8A:
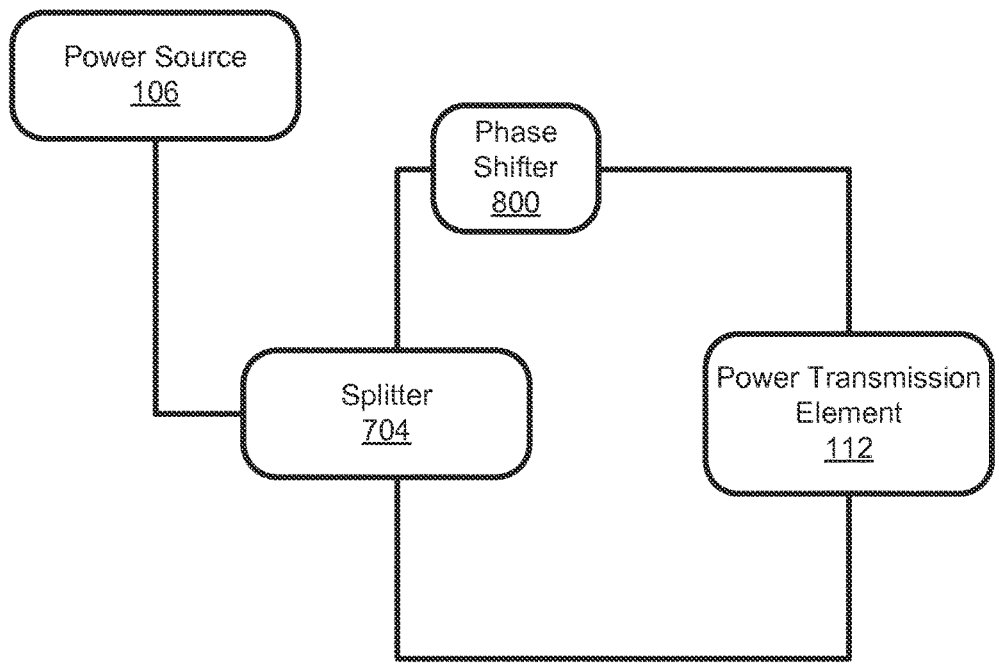
FIGS. 8A-8B includes schematic illustrations of a dual power feed and phase shifting configuration for a single plasma source process chamber and a dual plasma source process chamber.
Figure 8B:
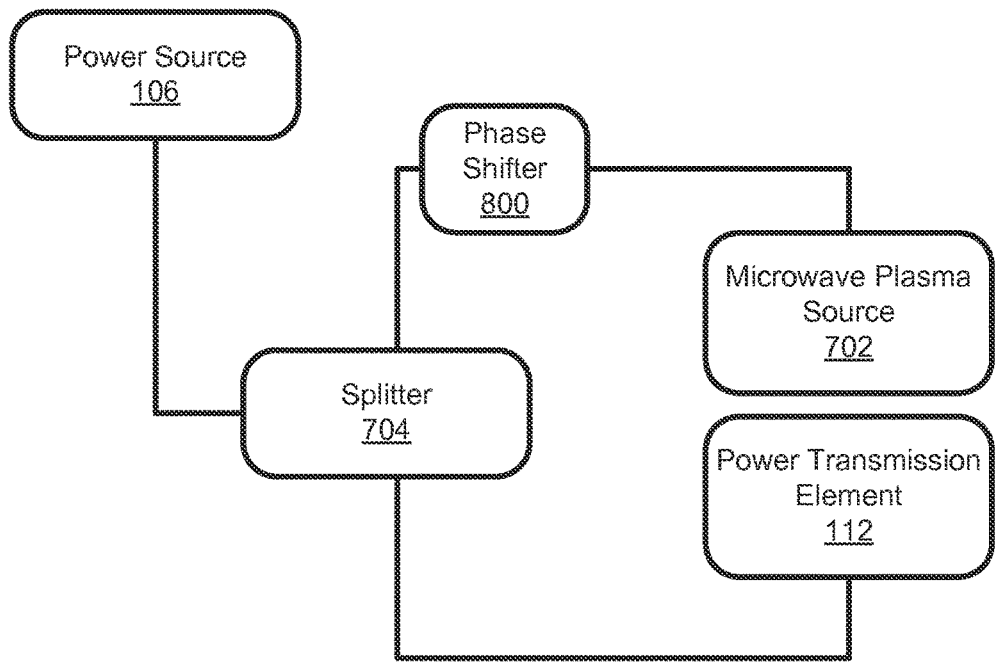

FIGS. 8A-8B includes schematic illustrations of a dual power feed and phase shifting configuration for a single plasma source process chamber and a dual plasma source process chamber. In these embodiments, the phase angle shifting component 800 may be used to adjust the phase angle of at least one of the two or more paths prior to reaching the power transmission element 112 and/or the microwave plasma source 702.

In one embodiment, the phase angle represents the difference between two electromagnetic waves that may have the same frequency, but are not aligned with each other with respect to the same point in time. In this way, each of the electromagnetic waves may have a different magnitude at each point in time. The electromagnetic waves may be said to be out of phase with each other and the phase angle may represent the degree or amount that the electromagnetic waves are out of phase. In contrast, the electromagnetic waves may be considered in phase within each other when the magnitudes of the electromagnetic waves have the same or similar magnitudes for each instance of time. The phase angle may be measured in degrees or radians and may apply to a variety of waves forms (e.g., sine, cosine) generated by the power source 106. In one embodiment, the electromagnetic waves may be 90 degrees our of phase such that the magnitude of a first electromagnetic wave may be at a positive peak value while the magnitude of the second electromagnetic wave may be at a null or zero magnitude at the same instance of time. A similar result may also be present when the phase angle between the two electromagnetic waves is at 180 degrees or 270 degrees, but that the 180 degree embodiment has the magnitude values reversed between the first and second electromagnetic wave. The 270 degree embodiment may have the first electromagnetic wave at a negative peak value while the second electromagnetic wave may be at a null or zero magnitude. In other embodiments the phase angle may vary between zero and 360 degrees between the two or more electromagnetic waves provided to the power transmission element 112.

The phase angle differences between the electromagnetic waves may increase power stability within the plasma processing region by minimizing the power variation caused by the oscillation between peak-to-peak magnitude values of the electromagnetic wave. For example, the two or more out of phase electromagnetic waves may reduce the amount of time the plasma processing region may be exposed to null or near-null magnitudes from the oscillation (e.g., sine wave) of the electromagnetic waves. Hence, there may be less plasma density variation within the plasma processing region over time.

In another embodiment, tuning elements XXX for each feed may be disposed between the interior cavity 122 and the power source 106 or splitter component 704. The tuning elements may comprise tuning stubs and/or plungers that may be used to match the impedance between the electromagnetic wave and the plasma processing region. The one or more tuning stubs may be arranged across the feed at right angles to the path of the electromagnetic wave. The tuning stub lengths may be varied to increase the range of impedance matching to account for a variety of frequencies and amplitudes of the electromagnetic waves and the load in the plasma processing region. The location of the tuning elements may be at least ¼ of the wavelength of the electromagnetic wave from the power distribution element 404 provided to the interior cavity.

The tuning stubs may be mechanically, pneumatically, or electrically actuated to different lengths within the wave guide ranging a flush position, with respect to the wave guide, to extending across to the opposite side of the wave guide.

In other embodiments, a plunger may be incorporated into the feed at or near the same location as the tuning stubs, or may be used as an alternative to the tuning stubs. The plunger may be used to alter the geometry of the feed line to also match impedance between the electromagnetic waves and the plasma processing region.

The tuning elements and/or plunger may be incorporated into any feed embodiment, such as those described in the descriptions of FIGS. 7A-9B.

In FIG. 8A, the plasma processing system 100 may include two waveguides between the splitter component 704 and the power transmission element 112. The phase shift component 800 is shown one of the two waveguide paths, but additional phase shifters 800 may be incorporated into additional waveguide paths when they are present.

In FIG. 8B, the phase shift component 800 may be incorporated into the waveguide path for the microwave plasma source 702 to vary the phase angle electromagnetic wave that may not be provided to the power transmission element. In other embodiments, the phase shift component 800 may be used to vary the electromagnetic wave provided to the power transmission element instead of the microwave plasma source 702. In certain instances, each of the split paths between the microwave plasma source 702 and the power transmission element 112 may include a phase shift component 800. The phase shift components 800 may vary phase angle independently of any phase angle changes made by the splitter 704 or generated by the power source 106.

Figure 9A:
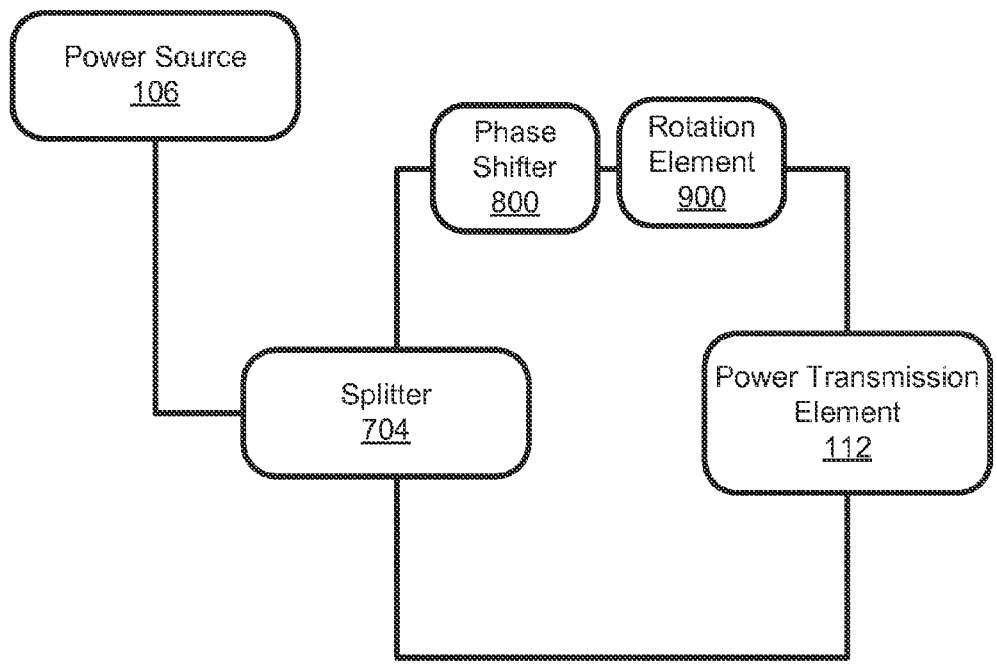
FIGS. 9A-9B includes schematic illustrations of a dual power feed, phase shifting, and field rotation configuration for a single plasma source process chamber and a dual plasma source process chamber.
Figure 9B:
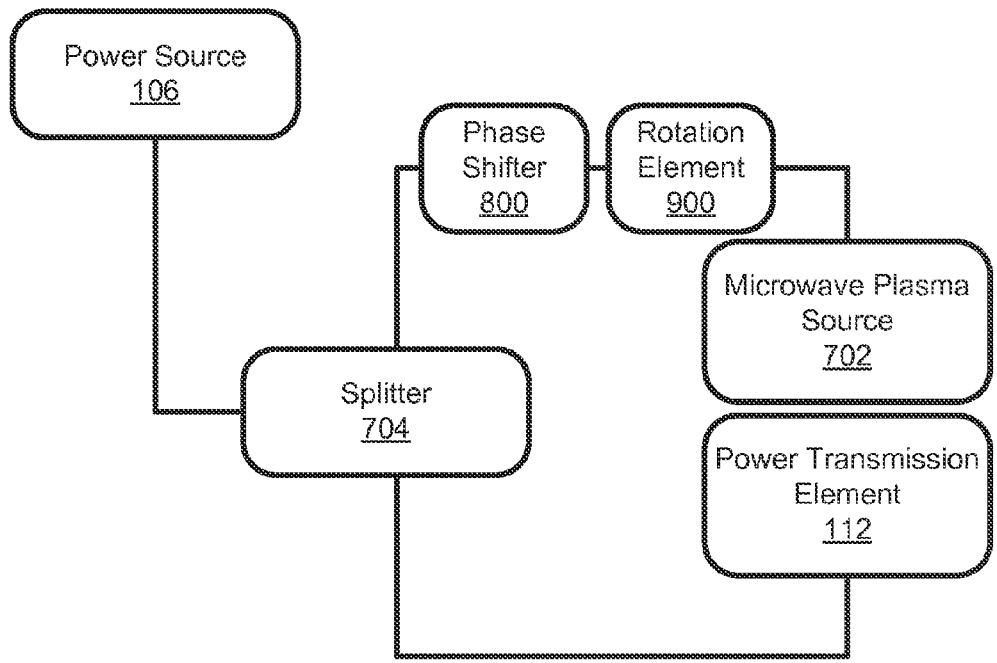

FIGS. 9A-9B includes schematic illustrations of a dual power feed, phase shifting, and field rotation configuration for a single plasma source process chamber and a dual plasma source process chamber. However, in other embodiments, the rotation element 900 may be used without the phase shift component 800 or the splitter component 704. The rotation element 900 may be any device that changes the orientation of the field of the electromagnetic wave. The orientation of the field relative to the slit 124 may impact the magnitude of the power emitted into the plasma processing region. As described above in the description of FIG. 6A, the first field embodiment 604, the second field embodiment 606, and the third field embodiment 608 are examples of the orientation differences of the field relative to the slit 124.

In FIG. 9A, the rotation element 900 may be disposed between the phase shift component 800 and the power transmission element 900. The field may be rotated up 360 degrees by the rotation element 900. In other embodiments, the rotation element 900 may be disposed on the opposite waveguide that doesn't include the phase shift component 800. This may allow the phase angle shifting and the field rotation to be done on separate electromagnetic waves that are provided to the power transmission element 112.

In FIG. 9B, the rotation element 900 may be disposed between the phase shift component 800 and the microwave plasma source 702 and may vary the phase angle and field of the first electromagnetic wave split by the splitter component 704. The second electromagnetic wave split from the power source 106 may be provided to the power transmission element 112. In other embodiments, the phase shift component 800 and the rotation element 900 may be used together or separate on any multi-feed designs between the microwave plasma source 702 and the power transmission element 112.

Figure 10:
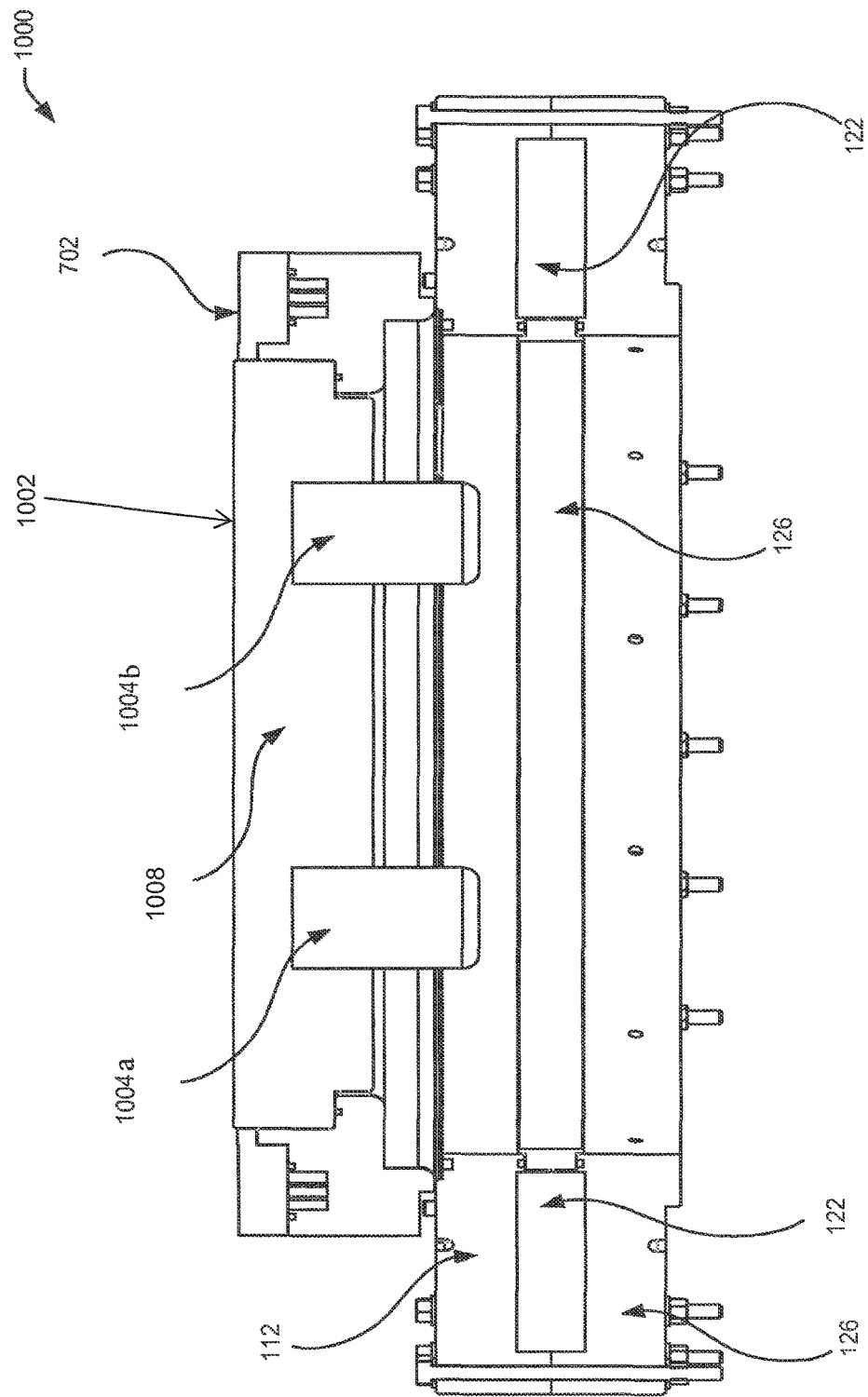
FIG. 10 includes a cross section illustration of a circular power transmission element coupled to a surface wave plasma source that includes a microwave cavity and dielectric components that emit energy into the plasma processing region.

FIG. 10 includes a cross section illustration 1000 of a circular power transmission element 112 coupled to a microwave wave plasma source 702 that includes a microwave cavity 1002 comprising an enclosure 1008 and dielectric poles 1004a, 1004b that are positioned within the enclosure 1008 and extend from the enclosure 1008 to a position in the plasma processing region above the dielectric component 126 and emit energy into the plasma processing region. In this embodiment, the electromagnetic wave may propagate through the interior cavity 122 and microwave cavity 1002 and emit energy through the dielectric component 126 and the dielectric poles 1004, respectively, into the plasma processing region. The microwave cavity 1002 may receive the electromagnetic waves from the power source 106 that may also provide electromagnetic waves to the interior cavity 122 of the power transmission element 112 disposed below the microwave cavity 1002. However, the sources are not required to use the same exact power source 106.

The microwave cavity 1002 may be of any configuration capable of propagating an electromagnetic wave towards or around the dielectric poles 1004a, 1004b. The electromagnetic wave may form power peaks within the microwave cavity, which may or may not coincide with the location of the dielectric poles 1004a, 1004b. For example, in one embodiment, the dielectric poles 1004a, 1004b may be positioned where the electric field of the electromagnetic wave is the strongest or at or near peak values.

In one embodiment, energy from the electromagnetic waves may be transferred to the dielectric poles 1004a, 1004b that may have a diameter of no more than a ¼ of the wavelength being propagated through the microwave cavity 1002. The dielectric poles 1004a, 1004b may provide a propagation medium for the electromagnetic waves and guide the energy towards the plasma processing region. The electromagnetic energy may be emitted from the dielectric poles 1004a, 1004b and generate a plasma using process gases within the plasma processing region. In another embodiment, the dielectric poles 1004a, 1004b may have a cylindrical configuration with a diameter between 1 mm and 5 mm. The length of the dielectric poles may be long enough to propagate at least a portion of the electromagnetic wave from the microwave cavity 1002 to the plasma processing region. In one specific embodiment, the length of the dielectric poles 1004a, 1004b may be at least 5 mm.

The dielectric poles 1004a, 1004b may be made of any dielectric material such as, but not limited to, quartz or ceramic materials. The dielectric poles 1004a, 1004b may be arranged in pairs that correspond with the power peaks of the electromagnetic waves propagating through the microwave cavity 1002. They may be configured as a group of even or odd numbers one, two, four, six, seven or more depending on the size of the microwave cavity and the wavelength of the propagating electromagnetic wave. Coupling may be adjusted by changing the parameters that directly correspond to the peak power pattern, such as dimensions of the interior cavity 122, and frequency, providing a tuning knob for plasma uniformity.

The incoming electromagnetic wave may be received using any of the embodiments described above in the descriptions of FIGS. 1-9B. Plasma uniformity or stability may be achieved in coordination with the electromagnetic energy provided by the power transmission element 112 that may be disposed adjacent to the microwave cavity 1002. However, the FIG. 10 embodiment may not be the only way to introduce electromagnetic energy to the plasma processing region in cooperation with the power transmission element 112.

Figure 11:
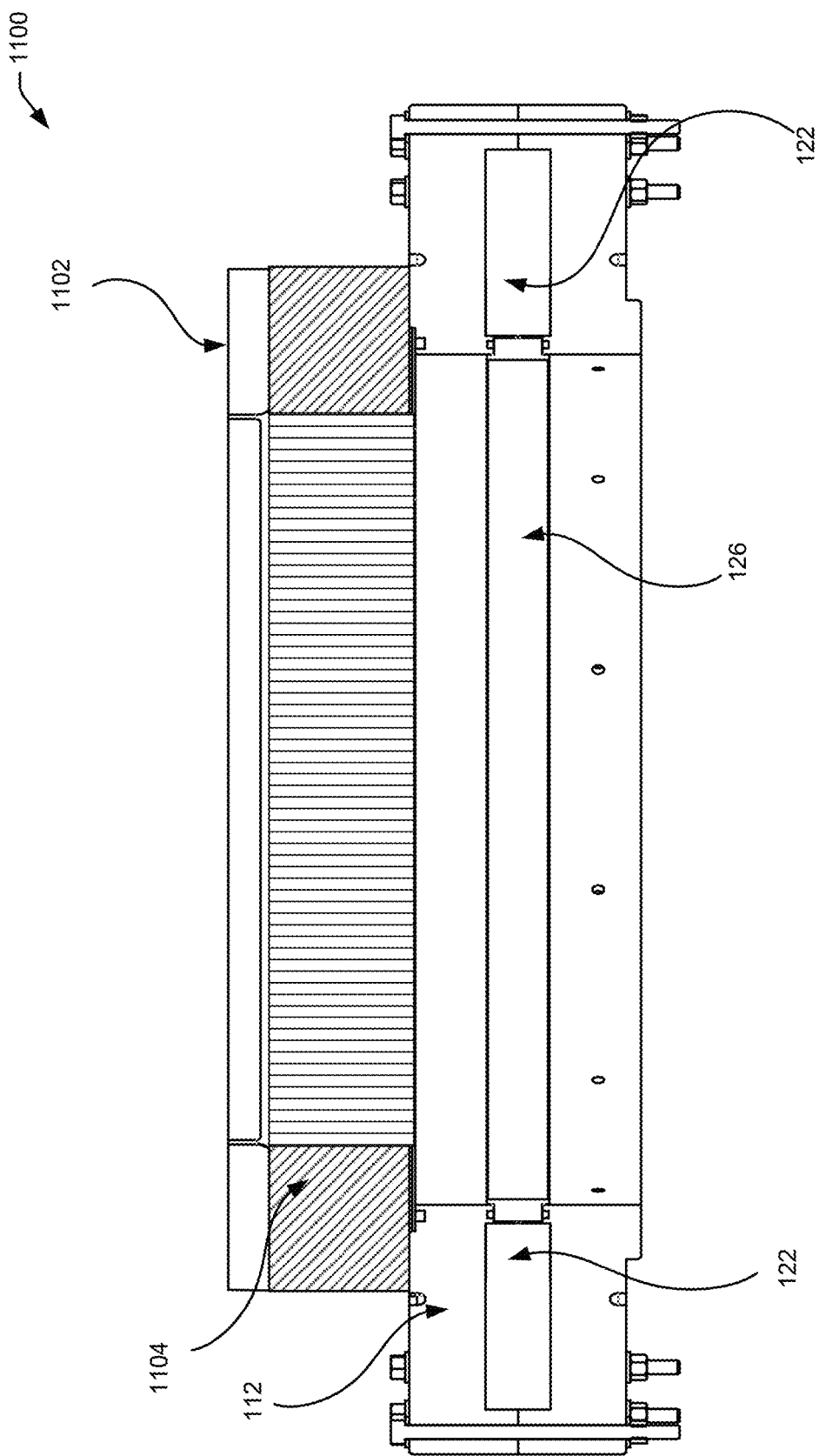
FIG. 11 includes a cross section illustration of a circular power transmission element coupled to a magnetic wave plasma source that emits energy into the plasma processing region.

FIG. 11 includes a cross section illustration 1100 of a circular power transmission element 112 connected to a magnetic wave plasma source 1102 that emits energy into the plasma processing region. The magnetic energy emitted from the magnetic wave plasma source 1102 can generate plasma, or push or pull the plasma to change the uniformity within the plasma processing region.

In this embodiment, the magnet 1104 may wrap around at least a portion of the plasma processing region may have a smaller diameter than the power transmission element. In the FIG. 11 embodiment, the magnetic wave plasma source 1102 is shown to have a diameter that is comparable to the power transmission element 112. However, in other embodiments, the diameter of the magnetic wave plasma source 1102 may be much smaller, such that the magnet 1104 may be smaller than the inner diameter of the power transmission element. In this instance, the magnetic energy may be more highly focused on the center of the plasma processing region than the magnetic wave plasma source 1102 shown in the FIG. 11 embodiment.

Figure 12:
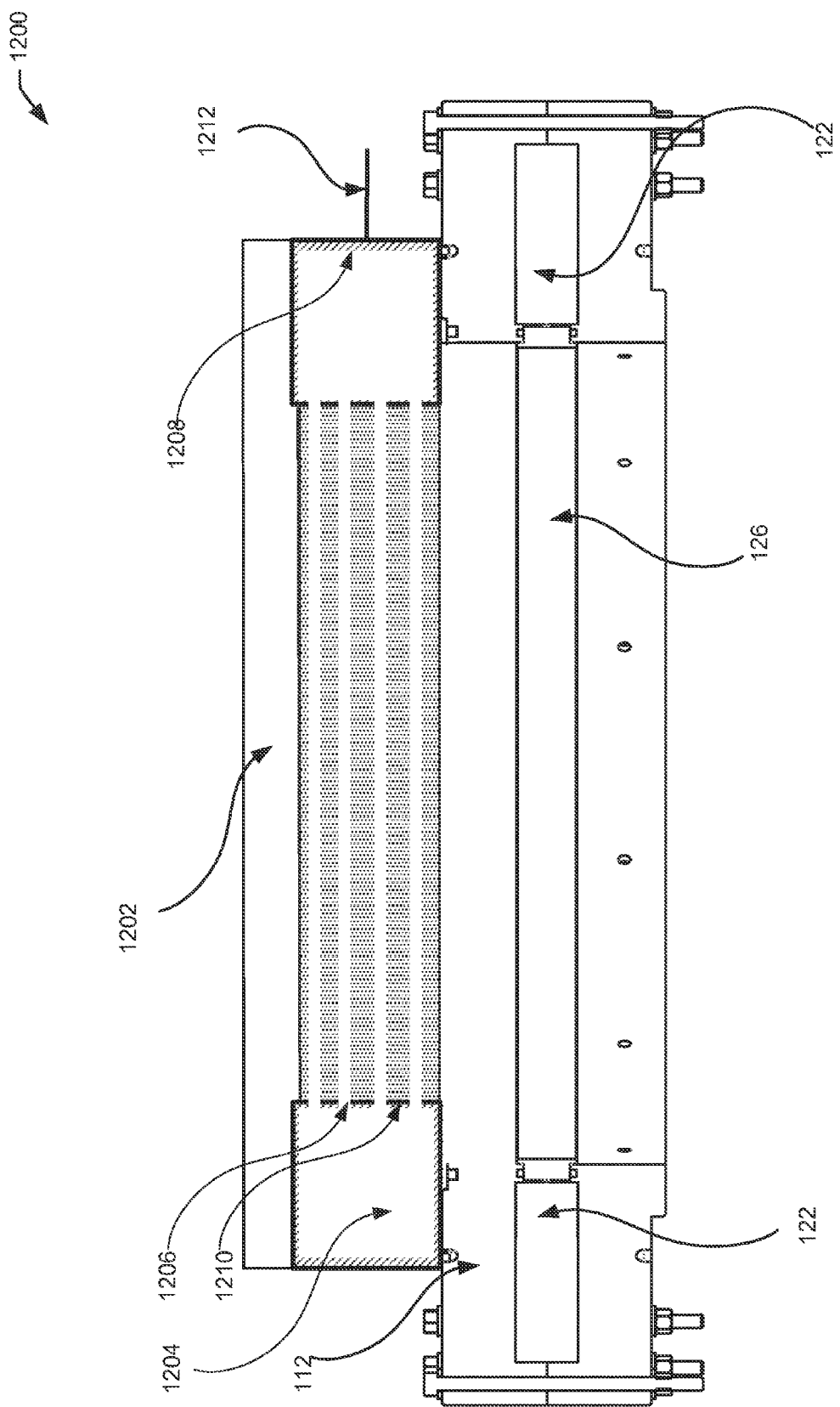
FIG. 12 includes a cross section illustration of a circular power transmission element coupled to a surface wave plasma source comprising an electric pressure source.

FIG. 12 includes a cross section illustration 1200 of a circular power transmission element 112 coupled to an electric pressure plasma source 1202 that can generate plasma within the plasma processing region. Generally, charged particles may be attracted to potential sources (e.g., chamber wall) and alter the plasma density profile due to the loss of the charged particles.

One approach to minimizing charged particle (e.g., ions) loss may be to alter the boundary potential proximate to the chamber wall in a way that may diffuse ions into the plasma chamber or push ions away from the chamber wall. The boundary potential or plasma sheath proximate to the chamber wall may be altered by including a ring cavity surrounding a portion of the chamber wall and that is in fluid communication with the plasma chamber via openings 1206 through the ring cavity wall 1210 and the plasma processing region. The ring cavity 1206 may include an electrode 1208 along an interior surface of the ring cavity 1206 that may be coupled to one or more power sources 1212 (e.g., direct current, radio frequency, etc.). The boundary potential or plasma sheath at the chamber wall may be altered by this arrangement in way that generates a plasma sheath conditions that enable the electric pressure concept by diffusing ions into the plasma chamber. In other words, the electric pressure may be enabled by forming a potential difference proximate to the chamber wall that may alter the plasma density or plasma sheath proximate to the chamber wall, such that the plasma density across the plasma chamber may be more uniform.

The ring cavity 1206 may wrap around at least a portion of the plasma processing region and may be placed above or below the power transmission element 112. In one specific embodiment, the electric pressure plasma source 1202 may be disposed below the substrate 114.

In one embodiment, this electric pressure may be generated using non-ambipolar-like diffusion of ions from the ring cavity 1206 to the plasma processing region. The non-ambipolar-like diffusion may occur between regions of different localized plasma densities. The diffusion may include the exchange of ions and electrons between the regions, in that the first region (e.g., inside the plasma chamber) may diffuse electrons towards a second plasma region and that the second region (e.g., ring cavity 1206) may diffuse ions towards the plasma region in a systematic manner. The diffusion of ions and electrons in opposing directions may enable an increase in ion density in the plasma processing region. The diffusion of the ions may alter the rate of ion loss from the plasma processing region to the plasma chamber wall. In this way, the plasma density exposed to the substrate may be more uniform, particularly near the edge of the substrate, such that substrate processing may be more uniform from the center to the edge of the substrate.

FIGS. 10-12 are merely representative examples of the plasma sources that may be combined with the power transmission element 112 to enable plasma processing of semiconductor substrates 114. In other embodiments, the combination of two or more of the plasma sources may be used with the power transmission element to enhance plasma density uniformity within the plasma processing region. For example, the power transmission element 112 may be disposed between the electric pressure plasma source 1202 and the microwave plasma source 702 or the magnetic wave plasma source 1100.

Figure 13A:
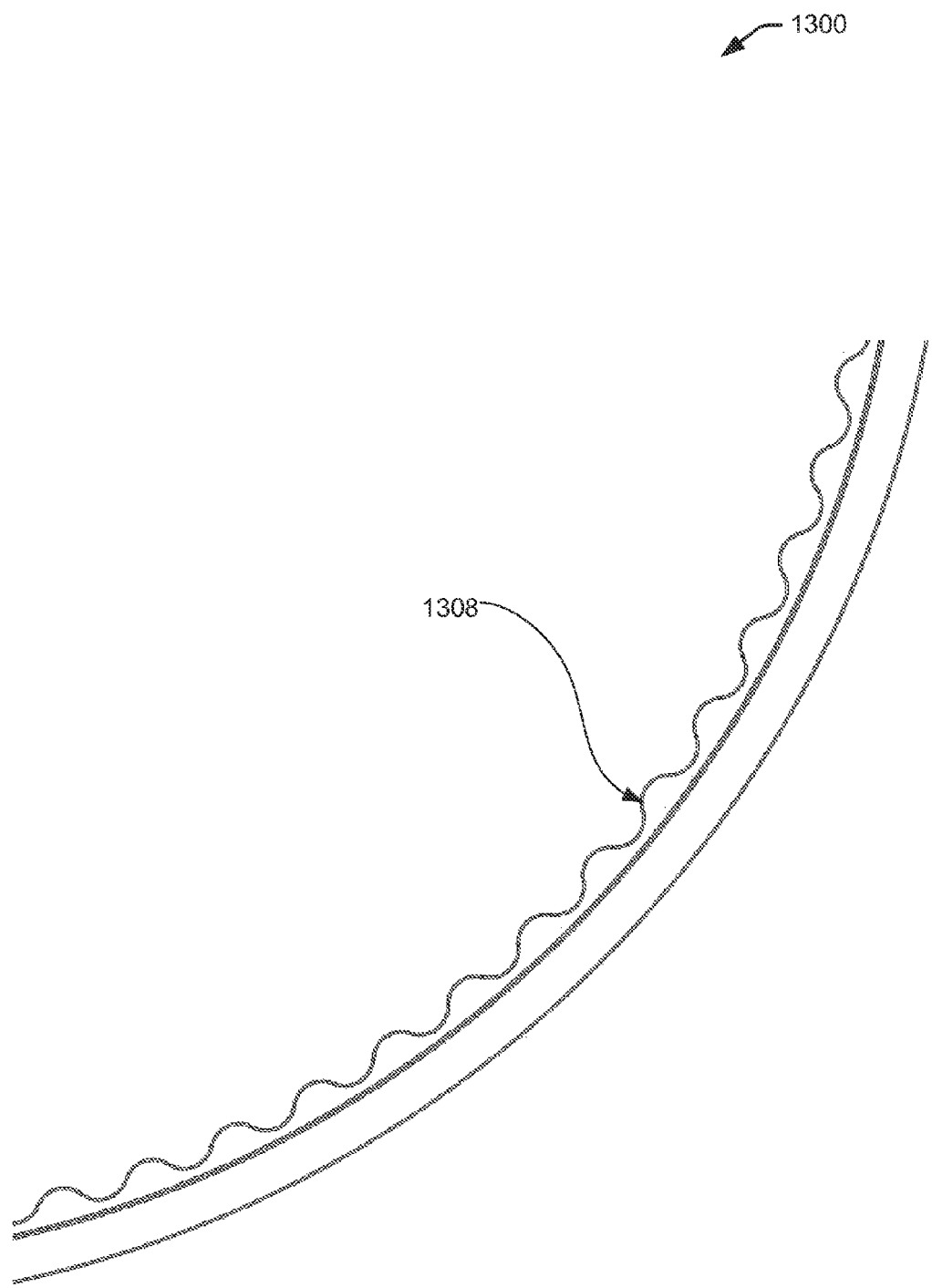
FIGS. 13A-13C includes illustrations of various embodiments of the dielectric component that may cover the continuous slit of the power transmission element.
Figure 13B:
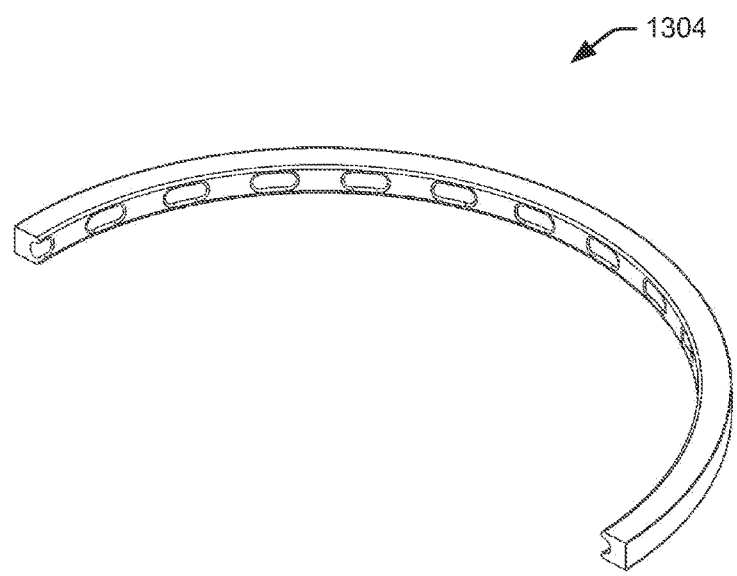
Figure 13C:
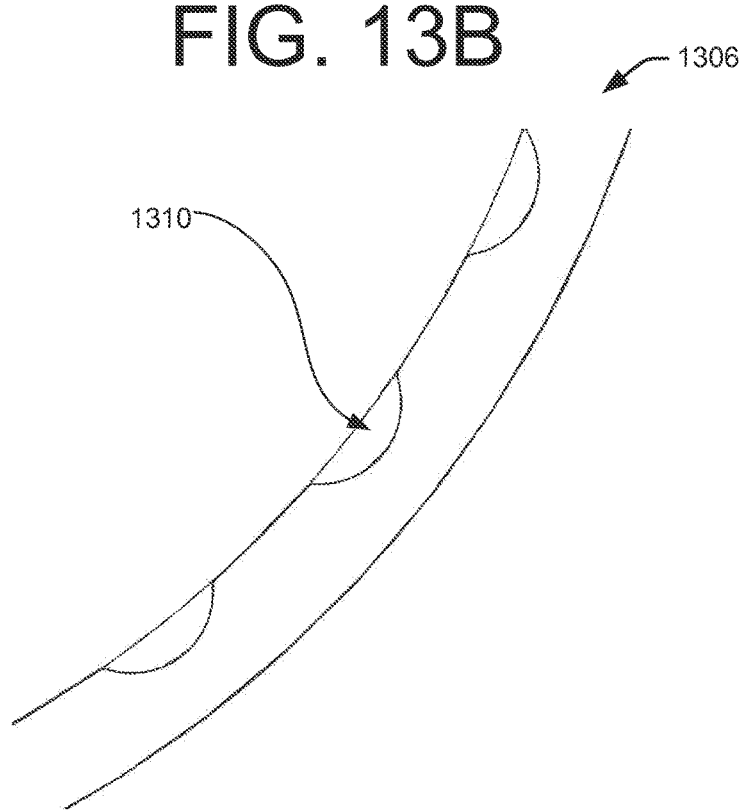

FIGS. 13A-13C includes cross section or perspective view illustrations of various embodiments of the dielectric component 126 that may cover the continuous slit 124 of the power transmission element 112. In FIG. 13A, a partial cross section view the wavy dielectric component 1300 that would be used with a circular power transmission element 112. FIG. 13B illustrates a partial perspective view of a pocket dielectric component 1304 that may be used with a circular power transmission element 112. FIG. 13C is a partial cross section view 1306 of the pocket dielectric component 1304. Although the embodiments illustrated in FIG. 13A-13C are directed to circular power transmission elements 112, these dielectric components 1300, 1304 may also be used with non-circular power transmission elements.

FIG. 13A illustrates a cross section of the wavy dielectric component 1300 that comprises a wave pattern 1308 that repeats and may face towards the plasma processing region from the slit 124 of the power transmission element 112. The wave pattern 1308 may vary in frequency and amplitude to account for the power peak locations of the electromagnetic wave or based, at least in part, on plasma density profiles observed in the plasma processing region. In the FIG. 13A embodiment, the wave pattern 1308 may oscillate in a sine or cosine wave pattern.

FIG. 13B illustrates a perspective view of a pocket dielectric component 1304 that may comprise a plurality of pockets spaced along the surface that faces towards the plasma processing region from the slit 124 of the power transmission element 112. The pockets may be arranged according to a few embodiments that may be implemented based on the number of wave power peaks being generated by the electromagnetic wave propagating through the interior cavity 122.

In one embodiment, the number of pockets may be equal to the number of power peaks to maximize the power coupling efficiency and stability over a plasma processing range. In another embodiment, the number of pockets may be greater than the number of power peaks to enable alignment with a variety of power peak patterns that may be implemented using the power transmission element 112. In another embodiment, the number of pockets may be less than the number of power peaks to enable a wider power range that may be implemented in the power transmission element 112.

FIG. 13C illustrates a cross section view 1306 of one embodiment of the pocket dielectric component 1304 that indicates that the pocket 1310 may have a rounded surface that may be up to 11 mm deep and may be at least 2 mm apart from each other.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A plasma processing system, comprising:
   a plasma chamber comprising a plasma processing region that can support a semiconductor substrate;
   a power transmission element comprising:
      (i) a first interior cavity to propagate electromagnetic waves,
      (ii) an annular continuous slit along one side of the power transmission element, the annular continuous slit forming an annular continuous opening between the first interior cavity and an exterior surface of the power transmission element,
      (iii) a first power feed opening of the first interior cavity to receive the electromagnetic waves, and
      (iv) a first power distribution element disposed within the first interior cavity and opposite the power feed opening and the annular continuous slit, the first power distribution element comprising a geometry that splits the electromagnetic waves along opposing directions within the first interior cavity;
   a microwave power source that can provide the electromagnetic waves to the power transmission element;
   a dielectric component arranged to cover at least a portion of the annular continuous slit and to transmit at least a portion of energy from the electromagnetic waves through the annular continuous opening;
   the plasma processing region disposed adjacent to the power transmission element; and
   a microwave plasma source disposed above the plasma chamber and opposite the plasma processing region, the microwave plasma source including:
      (i) a second power feed opening that is in electrical communication with the microwave power source to receive the electromagnetic waves, and
      (ii) a microwave cavity disposed above the plasma processing region, the microwave cavity including:
         (a) an enclosure that enables the propagation of the electromagnetic waves and is fluidically isolated from the plasma processing region, and
         (b) a plurality of cylindrical dielectric poles that each (1) are positioned within the enclosure and extend from the enclosure to a position in the plasma processing region above the dielectric component, (2) propagate energy from the enclosure to the plasma processing region, and (3) have a diameter that is less than or equal to ¼ of the wavelength of the electromagnetic waves.

2. The system of claim 1, further comprising:
   a splitter disposed in electrical communication with the microwave power source, the power transmission element, and the microwave plasma source, and the splitter divides the electromagnetic waves between the first power feed opening and the second power feed opening.

3. The system of claim 2, wherein the microwave plasma source comprises a second power transmission element comprising a second power distribution element comprising a geometry that splits the electromagnetic waves along opposing directions within the second power transmission element.

4. The system of claim 2, further comprising:
   a phase shifter component disposed between the splitter and the first power feed opening or the second feed opening, the phase shifter can shift a phase angle of the electromagnetic waves such that the phase angles of the electromagnetic waves through the first power feed opening and the second power feed opening are different or equal.

5. The system of claim 4, further comprising:
   one or more field rotation components disposed between the microwave power source and the power transmission element or the microwave plasma source, the field rotation components can rotate the field of the electromagnetic waves.

6. The system of claim 2, further comprising:
   one or more field rotation components disposed between the microwave power source and the power transmission element or the microwave plasma source, the field rotation components can rotate a field of the electromagnetic waves.

7. The system of claim 1, wherein the microwave plasma source is disposed adjacent to the power transmission element.

8. The plasma processing chamber of claim 1, wherein the plurality of cylindrical dielectric poles each comprise:
   a length that is greater than a distance that enables the cylindrical dielectric pole to propagate at least a portion of the electromagnetic wave from the microwave cavity to the plasma processing region.

9. The plasma processing chamber of claim 8, wherein the plurality of cylindrical dielectric poles are at least a ¼ wavelength apart from each other.

10. The plasma processing system of claim 8, wherein the first power feed opening or the second power feed opening comprises one or more of the following disposed between power transmission element and the microwave power source:
    a splitter component to split the electromagnetic waves provided by the microwave power source;
    a phase angle shifting component to shift a phase angle of the electromagnetic waves provided by the microwave power source; or a field rotation component to rotate a field of the electromagnetic waves provided by the microwave power source.

11. The plasma processing system of claim 8, wherein the first power feed opening or the second power feed opening comprises two or more of the following disposed between power transmission element and the microwave power source:
- a splitter component to split the electromagnetic waves provided by the microwave power source;
- a phase angle shifting component to shift a phase angle of the electromagnetic waves provided by the microwave power source; or
- a field rotation component to rotate a field of the electromagnetic waves provided by the microwave power source.

12. The plasma processing system of claim 8, wherein the first power feed opening or the second power feed opening comprises all of the following components disposed between power transmission element and the microwave power source:
- a splitter component to split the electromagnetic waves provided by the microwave power source;
- a phase angle shifting component to shift a phase angle of the electromagnetic waves provided by the microwave power source; and
- a field rotation component to rotate a field of the electromagnetic waves provided by the microwave power source.

13. The plasma processing system of claim 1, wherein the first power distribution element is a vertical protrusion.

14. The plasma processing system of claim 1, wherein the power transmission element is disposed on a vertical side wall.

* * * * *